United States Patent
Xu et al.

(10) Patent No.: US 12,419,168 B2
(45) Date of Patent: Sep. 16, 2025

(54) DISPLAY PANEL AND DISPLAY APPARATUS

(71) Applicants: Ordos Yuansheng Optoelectronics Co., Ltd., Inner Mongolia (CN); BOE Technology Group Co., Ltd., Beijing (CN)

(72) Inventors: Jingyi Xu, Beijing (CN); Jianyun Xie, Beijing (CN); Zhenhong Xiao, Beijing (CN); Peirong Huo, Beijing (CN); Yi Fan, Beijing (CN); Xin Han, Beijing (CN); Feng Li, Beijing (CN)

(73) Assignees: Ordos Yuansheng Optoelectronics Co., Ltd., Inner Mongolia (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/702,104

(22) PCT Filed: Sep. 29, 2022

(86) PCT No.: PCT/CN2022/122804
§ 371 (c)(1),
(2) Date: Apr. 17, 2024

(87) PCT Pub. No.: WO2024/065454
PCT Pub. Date: Apr. 4, 2024

(65) Prior Publication Data
US 2025/0241143 A1    Jul. 24, 2025

(51) Int. Cl.
*H10K 59/131* (2023.01)
*G06F 3/041* (2006.01)
*H10K 59/40* (2023.01)

(52) U.S. Cl.
CPC ......... *H10K 59/131* (2023.02); *G06F 3/0412* (2013.01); *G06F 3/04164* (2019.05); *H10K 59/40* (2023.02)

(58) Field of Classification Search
None
See application file for complete search history.

(56) References Cited

U.S. PATENT DOCUMENTS

| 10,559,253 B1 * | 2/2020 | Li | H10K 59/131 |
| 11,003,302 B1 * | 5/2021 | Wu | G06F 3/047 |

(Continued)

FOREIGN PATENT DOCUMENTS

| CN | 108807426 A | 11/2018 |
| CN | 110187576 A | 8/2019 |
| CN | 111951687 A | 11/2020 |

*Primary Examiner* — Christopher R Lamb
(74) *Attorney, Agent, or Firm* — ArentFox Schiff LLP; Michael Fainberg

(57) ABSTRACT

A display panel includes a display area, a peripheral area and an opening area. The display panel includes: first data lines including first sub-data lines and second sub-data lines; data selectors including first data selectors and second data selectors, where the first data selectors are electrically connected with the first sub-data lines, and the second data selectors are electrically connected with the second sub-data lines; a plurality of data signal input terminals; a plurality of first data selection data lines including first sub-data selection data lines and second sub-data selection data lines, where the first sub-data selection data lines are electrically connected with the first data selectors, and the second sub-data selection data lines are electrically connected with the second data selectors and the data signal input terminal; and a plurality of first connection leads located outside the opening area and extending from the display area to the peripheral area.

20 Claims, 12 Drawing Sheets

(56) References Cited

U.S. PATENT DOCUMENTS

| | | | |
|---|---|---|---|
| 2018/0129111 A1* | 5/2018 | Wu | H10D 86/60 |
| 2018/0157362 A1* | 6/2018 | Kim | G06F 3/0412 |
| 2020/0064702 A1* | 2/2020 | Yeh | H10K 59/122 |
| 2021/0351261 A1 | 11/2021 | Kim et al. | |
| 2022/0102470 A1* | 3/2022 | Seo | H10K 59/1213 |
| 2024/0324362 A1* | 9/2024 | Jang | H10K 59/126 |

\* cited by examiner

DISPLAY PANEL AND DISPLAY APPARATUS

CROSS-REFERENCE TO RELATED APPLICATIONS

This application is a National Stage of International Application No. PCT/CN2022/122804, filed on Sep. 29, 2022, which is hereby incorporated by reference in its entirety.

TECHNICAL FIELD

The disclosure relates to the field of display technology, and in particular to a display panel and a display device.

BACKGROUND

In recent years, as people pursue the higher and higher screen occupation ratio, the full-screen technology has developed rapidly. Currently, the mainstream solution for the under-screen camera in the full-screen technology is to dig a hole in the display area (AA area) to place the camera. However, when an opening is arranged in the AA area, there is generally a certain distance between the inner wall of the opening and the boundary of the AA area, and the area between the inner wall of the opening and the boundary of the AA area needs to be equipped with signal lines in the same layer. When there are many wires that need to bypass the opening, the diameter of the opening may become larger, affecting the appearance; and the black edge of the non-display area may also appear, affecting the display effect.

SUMMARY

An embodiment of the disclosure provides a display panel, including: a display area, a peripheral area outside the display area, and an opening area located in the display area; the display panel includes:
  a plurality of first data lines arranged in a first direction and extending from the display area to the peripheral area in a second direction; where the first data lines include first sub-data lines and second sub-data lines respectively located on both sides of the opening area in the second direction, and the second direction intersects the first direction;
  a plurality of data selectors located in the peripheral area, including: a plurality of first data selectors located in the peripheral area on a side of the first sub-data lines away from the opening area, and a plurality of second data selectors located in the peripheral area on a side of the second sub-data lines away from the opening area; where the first data selectors are electrically connected with the first sub-data lines, and the second data selectors are electrically connected with the second sub-data lines;
  a plurality of data signal input terminals located on a side of the second data selectors away from the display area;
  a plurality of first data selection data lines, including: first sub-data selection data lines located on a side of the first data selectors away from the display area in the second direction, and second sub-data selection data lines located between the second data selectors and the data signal input terminals in the second direction; where the first sub-data selection data lines are electrically connected with the first data selectors, and the second sub-data selection data lines are electrically connected with the second data selectors and the data signal input terminals; and
  a plurality of first connection leads located outside the opening area in the first direction and extending from the display area to the peripheral area in the second direction; where the first sub-data selection data lines are electrically connected with the data signal input terminals through the first connection leads.

In some embodiments, the display panel further includes: a plurality of second connection leads located in the peripheral area and extending in the first direction;
  where the second connection leads are electrically connected with the first data selection data lines and the first connection leads.

In some embodiments, the first sub-data selection data line and the second sub-data selection data line included in the first data selection data line are electrically connected with different data signal input terminals respectively; and
  the second connection leads are electrically connected with the first data selection data lines and the first connection leads in the peripheral area on the side of the first data selectors away from the opening area.

In some embodiments, the first sub-data selection data line and the second sub-data selection data line included in the first data selection data line are electrically connected with a same data signal input terminal; and
  the second connection leads include: a plurality of first sub-connection leads and a plurality of second sub-connection leads located in the peripheral area and extending in the first direction;
  the first sub-connection leads are electrically connected with the first sub-data selection data lines and the first connection leads in the peripheral area on the side of the second data selectors away from the opening area; and
  the second sub-connection leads are electrically connected with the second sub-data selection data lines and the first connection leads in the peripheral area on the side of the second data selectors away from the opening area.

In some embodiments, a length of the second connection lead close to the display area is less than a length of the second connection lead away from the display area in the peripheral area located on a same side of the display area;
  orthographic projections of the plurality of second connection leads on a plane where the display panel is located do not overlap with each other; and the plurality of second connection leads are arranged in a same layer; and
  except for positions of electrical connections between the second connection leads and the first connection leads and positions of electrical connections between the second connection leads and the first sub-data selection data lines, the orthographic projections of the second connection leads on the plane where the display panel is located do not overlap with orthographic projections of the first connection leads on the plane where the display panel is located, and the orthographic projections of the second connection leads on the plane where the display panel is located do not overlap with orthographic projections of the first sub-data selection data lines on the plane where the display panel is located.

In some embodiments, orthographic projections of the plurality of second connection leads on a plane where the display panel is located do not overlap with each other; and the plurality of second connection leads are arranged in a same layer;

except for positions of electrical connections between the second connection leads and the first connection leads and positions of electrical connections between the second connection leads and the first data selection data lines, the first connection leads and the second connection leads with overlapped orthographic projections on a plane where the display panel is located are located in different film layers, and the first data selection data lines and the second connection leads with overlapped orthographic projections on the plane where the display panel is located are located in different film layers; and lengths of the second connection leads are equal in the peripheral area located on a same side of the display area.

In some embodiments, the display panel further includes a plurality of second data lines; where the second data lines are located outside the opening area in the first direction and extend from the display area to the peripheral area in the second direction; some of the plurality of second data selectors are electrically connected with the plurality of second sub-data lines, and other of the plurality of second data selectors are electrically connected with the plurality of second data lines; and each of the first connection leads is adjacent to one of the second data lines.

In some embodiments, the display panel further includes:

a plurality of data selection control signal lines located in the peripheral area and including parts extending in the first direction; where the plurality of data selection control signal lines include: a plurality of first data selection control signal lines electrically connected with the first data selectors, and a plurality of second data selection control signal lines electrically connected with the second data selectors;

the second connection leads are located on a side of the data selection control signal lines away from the display area; the first connection lead includes: a first part, and a second part and a third part respectively connected with the first part on both sides of the first part in the second direction; the second part is located on a side of the first part away from the data signal input terminal, and the third part is located on a side of the first part close to the data signal input terminal;

an orthographic projection of the first part on a plane where the display panel is located does not overlap with orthographic projections of the data selection control signal lines on the plane where the display panel is located, an orthographic projection of the second part on the plane where the display panel is located overlaps with orthographic projections of the first data selection control signal lines on the plane where the display panel is located, and an orthographic projection of the third part on the plane where the display panel is located overlaps with orthographic projections of the second data selection control signal lines on the plane where the display panel is located; and the data selection control signal lines and the second data lines are arranged in a same layer; the first part and the second data lines are arranged in a same layer and adjacent; and the second part and the third part are arranged in a same layer and located in a different layer from the first part.

In some embodiments, the second connection leads and the data selection control signal lines are arranged in a same layer.

In some embodiments, the first sub-data selection data line includes: a fourth part located in a different layer from the data selection control signal line;

the second sub-data selection data line includes: a fifth part located in a different layer from the data selection control signal line; and an orthographic projection of the fourth part on the plane where the display panel is located overlaps with an orthographic projection of the data selection control signal line on the plane where the display panel is located, and an orthographic projection of the fifth part on the plane where the display panel is located overlaps with the orthographic projection of the data selection control signal line on the plane where the display panel is located.

In some embodiments, the display panel further includes:

a plurality of second data selection data lines extending from the display area to the peripheral area in the second direction;

where the second data selectors that are not electrically connected with the first data selection data lines are electrically connected with the data signal input terminals through the second data selection data lines.

In some embodiments, the second data selection data line includes a sixth part located in a different layer from the second data line.

In some embodiments, the display panel further includes a plurality of dummy signal lines extending in the second direction; where some of the dummy signal lines are disconnected in the opening area; and at least some of the second data lines not adjacent to the first connection leads are adjacent to the dummy signal lines, and at least some of the first data lines are adjacent to the dummy signal lines.

In some embodiments, the dummy signal lines, the first data lines and the second data lines are arranged in a same layer.

In some embodiments, the display panel further includes: a plurality of touch signal lines extending from the display area to the peripheral area in the second direction, and a plurality of touch signal input terminals; where the touch signal lines are electrically connected with the touch signal input terminals; and the touch signal input terminal is located between two adjacent data signal input terminals.

In some embodiments, the display panel further includes a dummy signal line;

where the data selector includes: a first transistor, a second transistor and a third transistor;

the plurality of data selection control signal lines include: a first data selection control signal line, a second data selection control signal line, and a third data selection control signal line;

a gate of the first transistor is electrically connected with the first data selection control signal line, a gate of the second transistor is electrically connected with the second data selection control signal line, and a gate of the third transistor is electrically connected with the third data selection control signal line;

in each of the data selectors, a source of the first transistor, a source of the second transistor and a source of the third transistor are all electrically connected with a same first data selection data line or a same second data selection data line;

in each of the data selectors, a drain of the first transistor, a drain of the second transistor and a drain of the third transistor are electrically connected with different first data lines or different second data lines respectively;

the first data line electrically connected with the drain of the first transistor is adjacent to the dummy signal line or the touch signal line; and the second data line electrically connected with the drain of the first transistor is adjacent to the dummy signal line or the touch signal line; and the first data line electrically connected with the drain of the second transistor is adjacent to the dummy signal line; and the second data line electrically connected with the drain of the second transistor is adjacent to the first connection lead or the dummy signal line.

In some embodiments, the first data line electrically connected with the drain of the third transistor is not adjacent to the dummy signal line or the touch signal line, and the second data line electrically connected with the drain of the third transistor is not adjacent to any of the first connection lead, the dummy signal line and the touch signal line; and in the first direction, a width of the first data line electrically connected with the drain of the third transistor is greater than a width of the first data line electrically connected with the drain of the second transistor and a width of the first data line electrically connected with the drain of the first transistor; and a width of the second data line electrically connected with the drain of the third transistor is greater than a width of the second data line electrically connected with the drain of the second transistor and a width of the second data line electrically connected with the drain of the first transistor.

In some embodiments, the dummy signal lines, the first data lines and the second data lines are arranged in a same layer.

In some embodiments, the display panel further includes: a plurality of fourth connection leads extending in the first direction;

where the plurality of touch signal lines include: a plurality of first touch signal lines disconnected in the opening area, a plurality of second touch signal lines located outside the opening area in the first direction, and a plurality of third connection leads located outside the opening area in the first direction;

the first touch signal lines are adjacent to the first data lines, and the second touch signal lines and the third connection leads are adjacent to the second data lines;

the first touch signal line includes: a first sub-touch signal line adjacent to the first sub-data line, and a second sub-touch signal line adjacent to the second sub-data line;

both ends of the fourth connection lead are electrically connected with the first sub-touch signal line and the third connection lead respectively; and the second touch signal line, the third connection lead, and the second sub-touch signal line are all electrically connected with the touch signal input terminal.

In some embodiments, the fourth connection leads are located on a side of the second connection leads away from the display area;

the first sub-touch signal line includes: a seventh part arranged in a same layer as and adjacent to the first sub-data line, and an eighth part electrically connected with the seventh part on a side of the seventh part away from the opening area;

the second sub-touch signal line includes: a ninth part arranged in a same layer as and adjacent to the second sub-data line, and a tenth part electrically connected with the ninth part on a side of the ninth part away from the opening area;

the second touch signal line includes: an eleventh part arranged in a same layer as and adjacent to the second data line, and a twelfth part electrically connected with the eleventh part on a side of the eleventh part close to the touch signal input terminal; and in a direction perpendicular to the plane where the display panel is located, an orthographic projection of the eighth part overlaps with an orthographic projection of the second connection lead and an orthographic projection of the data selection control signal line, an orthographic projection of the tenth part overlaps with the orthographic projection of the second connection lead and the orthographic projection of the data selection control signal line, and an orthographic projection of the twelfth part overlaps with the orthographic projection of the data selection control signal line.

In some embodiments, the display panel further includes: a plurality of scan lines extending from the display area to the peripheral area in the second direction;

where the scan lines include: a first scan line located outside the opening area, and a second scan line disconnected in the opening area.

An embodiment of the disclosure provides a display device, including the display panel according to embodiments of the disclosure.

BRIEF DESCRIPTION OF FIGURES

In order to illustrate technical solutions in embodiments of the disclosure more clearly, accompanying drawings which need to be used in describing embodiments will be introduced below briefly. Obviously the accompanying drawings described below are only some embodiments of the disclosure, and other accompanying drawings can also be obtained by those ordinary skilled in the art according to these accompanying drawings without creative labor.

DETAILED DESCRIPTION

In order to make purposes, technical solutions and advantages of the disclosure clearer, technical solutions of embodiments of the disclosure will be described clearly and completely below in combination with the accompanying drawings of embodiments of the disclosure. Obviously the described embodiments are a part of embodiments of the disclosure but not all embodiments. Also in the case of no conflict, embodiments and the features therein in the disclosure can be combined with each other. Based upon embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The "first", "second" and similar words used in the disclosure do not represent any order, number or importance, and are only configured to distinguish different components. The word such as "include" or "contain" or the like means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect.

It is necessary to note that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Figure 1:
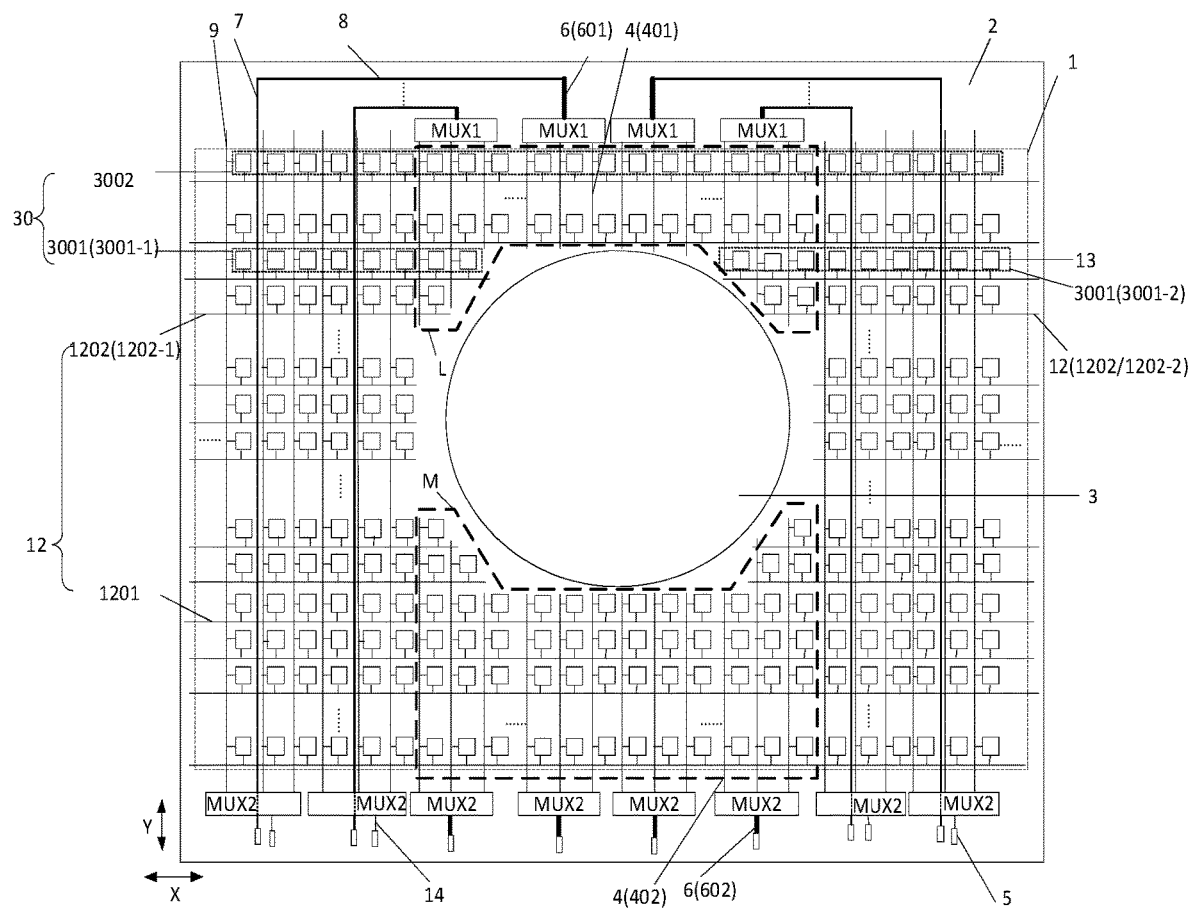
FIG. 1 is a structural schematic diagram of a display panel according to an embodiment of the disclosure.

An embodiment of the disclosure provides a display panel. As shown in FIG. 1, the display panel includes: a display area 1, a peripheral area 2 outside the display area 1, and an opening area 3 located in the display area 1.

The Display Panel Includes:
  a plurality of first data lines 4 arranged in a first direction X and extending from the display area 1 to the peripheral area 2 in a second direction Y; where the first data lines 4 include first sub-data lines 401 and second sub-data lines 402 respectively located on both sides of the opening area 3 in the second direction Y, and the second direction Y intersects the first direction X;
  a plurality of data selectors MUX located in the peripheral area 2, including: a plurality of first data selectors MUX1 located in the peripheral area 2 on a side of the first sub-data lines 401 away from the opening area, and a plurality of second data selectors MUX2 located in the peripheral area 2 on a side of the second sub-data lines 402 away from the opening area; where the first data selectors MUX1 are electrically connected with the first sub-data lines 401, and the second data selectors MUX2 are electrically connected with the second sub-data lines 402;
  a plurality of data signal input terminals 5 located on a side of the second data selectors MUX2 away from the display area 1;
  a plurality of first data selection data lines 6, including: first sub-data selection data lines 601 located on a side of the first data selectors MUX1 away from the display area 1 in the second direction Y, and second sub-data selection data lines 602 located between the second data selectors MUX2 and the data signal input terminals 5 in the second direction Y; where the first sub-data selection data lines 601 are electrically connected with the first data selectors MUX1, and the second sub-data selection data lines 602 are electrically connected with the second data selectors MUX2 and the data signal input terminals 5; and
  a plurality of first connection leads 7 located outside the opening area 3 in the first direction X and extending from the display area 1 to the peripheral area 2 in the second direction Y; where the first sub-data selection data lines 601 are electrically connected with the data signal input terminals 5 through the first connection leads 7.

It should be noted that the first connection leads 7 need to pass through the area of the second data selectors MUX2 to be electrically connected with the data signal input terminals 5 in FIG. 1. The first connection leads 7 in this area are represented by dotted lines, indicating that the first connection leads 7 here are not electrically connected with the second data selectors MUX2.

In some embodiments, the display panel further includes: a plurality of second connection leads 8 located in the peripheral area 2 and extending in the first direction X.

The second connection leads 8 are electrically connected with the first data selection data lines 6 and the first connection leads 7.

In the display panel according to embodiments of the disclosure, the first data lines are disconnected in the opening area, the first sub-data line located on a side of the opening area is electrically connected with the data signal input terminal through the data selector, the first sub-data selection data line, and the first connection lead located outside the opening area, and the second sub-data line located on the other side of the opening area is also electrically connected with the data signal input terminal through the data selector and the second sub-data selection data line, so as to provide data signals to the first data lines disconnected in the opening area to achieve the normal display. The first data lines are disconnected in the opening area, that is, the first data lines do not need to be arranged around the opening area, avoiding the increased diameter of the area surrounded by the display area due to the first data lines arranged around the opening area, and also avoiding black edges in the opening area, improving the display effect, and improving the user experience. Moreover, a data selector is electrically connected with a plurality of first data lines, and the data selector is electrically connected with the data signal input terminal through the first data selection data line, that is, the data selector is configured to provide a data signal to the first data line. A data selector can provide data signals to the plurality of first data lines, reducing the number of data signal input terminals and saving the cost. Also, the number of first data selection data lines is also less than the number of first data lines, reducing the number of leads provided in the peripheral area. This is more conducive to reducing the size of the peripheral area while saving the cost, and is more conducive to realizing the narrow frame display.

It should be noted that the first direction X is perpendicular to the second direction Y as an example for illustration in FIG. 1.

In some embodiments, as shown in FIG. 1, the display panel further includes a plurality of second data lines 9; where the second data lines 9 are located outside the opening area 3 in the first direction X and extend from the display area 1 to the peripheral area 2 in the second direction Y; some of the plurality of second data selectors MUX2 are electrically connected with the plurality of second sub-data lines 402, and other of the plurality of second data selectors MUX2 are electrically connected with the plurality of second data lines 9.

In some embodiments, as shown in FIG. 1, the display panel further includes: a plurality of second data selection data lines 14 extending from the display area 1 to the peripheral area 2 in the second direction Y.

The second data selectors MUX2 that are not electrically connected with the first data selection data lines 6 are electrically connected with the data signal input terminals 5 through the second data selection data lines 14.

That is, the second data lines 9 penetrate through the display area 1 and are electrically connected with the second data selectors MUX2 located in the peripheral area 2, and the second data selectors MUX2 electrically connected with the second data lines 9 are electrically connected with the data signal input terminals 5 through the second data selection data lines 14.

In some embodiments, as shown in FIG. 1, each of the first connection leads 7 is adjacent to one of the second data lines 9.

During specific implementation, as shown in FIG. 1, the display area 1 includes: sub-pixel units 13 arranged in an array and avoiding the opening area 3. The sub-pixel units arranged in the array are divided into a plurality of sub-pixel columns arranged in the first direction X and extending in the second direction Y. The plurality of sub-pixel columns include a plurality of first sub-pixel columns and a plurality of second sub-pixel columns. The first sub-pixel columns are disconnected in the opening area, one of the first data lines is electrically connected with one of the first sub-pixel columns, and one of the second data lines is electrically connected with one of the second sub-pixel columns.

The first data lines and the second data lines are both data lines that transmit data signals to the sub-pixels, and the first data selection data lines and the second data selection data lines are both data selection data lines that transmit data signals to the data selectors. In the display panel according to embodiments of the disclosure, a data selector is electrically connected with a plurality of data lines, and the data selector is electrically connected with the data signal input terminal through the data selection data line, that is, the data selector is configured to provide a data signal to the data line. A data selector can provide data signals to the plurality of data lines, reducing the number of data signal input terminals and saving the cost. Also, the number of data selection data lines is also less than the number of data lines, reducing the number of leads provided in the peripheral area. This is more conducive to reducing the size of the peripheral area while saving the cost, and is more conducive to realizing the narrow frame display.

During specific implementation, as shown in FIG. 1, the first connection lead 7 is adjacent to the second data line 9 on the left side of the second data line 9.

That is, during specific implementation, the first connection lead is located in the area between the second data line and the sub-pixel column, and the sub-pixel column is adjacent and not electrically connected with the second data line.

In some embodiments, as shown in FIG. 1, the display panel further includes: a plurality of scan lines 12 extending from the display area 1 to the peripheral area 2 in the second direction Y.

The scan lines 12 includes: a first scan line 1201 located outside the opening area 3, and a second scan line 1202 disconnected in the opening area 3; that is, the second scan line 1202 includes a first sub-scan line 1202-1 and a second sub-scan line 1202-2 respectively located on both sides of the opening area 3 in the first direction X.

In the display panel according to embodiments of the disclosure, the second scan line is disconnected in the opening area, so that the second scan line does not need to be arranged around the opening area, avoiding the increased diameter of the area surrounded by the display area due to the second scan line arranged around the opening area, further avoiding black edges in the opening area, improving the display effect, and improving the user experience.

During specific implementation, as shown in FIG. 1, the sub-pixel units 13 arranged in the array are divided into a plurality of sub-pixel rows 30 extending in the first direction X and arranged in the second direction Y. The plurality of sub-pixel rows 30 include a plurality of first sub-pixel rows 3001 and a plurality of second sub-pixel rows 3002. The first sub-pixel rows 3001 are disconnected in the opening area 3, one of the second scan lines 1202 is electrically connected with one of the first sub-pixel rows 3001, the first sub-scan line 1202-1 is electrically connected with the part 3001-1 of the first sub-pixel row 3001 located on the left side of the opening area 3, and the second sub-scan line 1202-2 is electrically connected with the part 3001-2 of the first sub-pixel row 3001 located on the right side of the opening area 3; and one of the first scan lines 1201 is electrically connected with one of the second sub-pixel rows 3002.

During specific implementation, the peripheral areas located on both sides of the display area in the first direction include scan signal input terminals electrically connected with the scan lines, that is, bidirectional driving of the sub-pixel units in the first direction can be achieved, so that the input of the scan signal will not be affected even if the second scan line is disconnected in the opening area.

During specific implementation, the data signal input terminal is electrically connected with a drive chip, and the drive chip provides a data signal to be written into the data signal input terminal. When the scanning signal scans a sub-pixel unit above the opening area (such as a sub-pixel unit in the area L in FIG. 1), the drive chip provides data signals to the first connection lead, the first sub-data selection data line, the first data selector and the first sub-data line through the data signal input terminal. When the scanning signal scans a sub-pixel unit below the opening area (such as a sub-pixel unit in the area M in FIG. 1), the drive chip provides data signals to the second sub-data selection data line, the second data selector and the second sub-data line through the data signal input terminal, so as to provide data signals to the first data lines disconnected in the opening area to achieve the normal display.

During specific implementation, data signals may be provided to the first sub-data selection data line and the second sub-data selection data line in the same first data selection data line through different data signal input terminals. In some embodiments, as shown in FIG. 1, the first sub-data selection data line 601 and the second sub-data selection data line 602 included in the first data selection data line 6 are electrically connected with different data signal input terminals 5 respectively.

The second connection leads 8 are electrically connected with the first data selection data lines 6 and the first connection leads 7 in the peripheral area 2 on the side of the first data selectors MUX1 away from the opening area 3.

Figure 2:
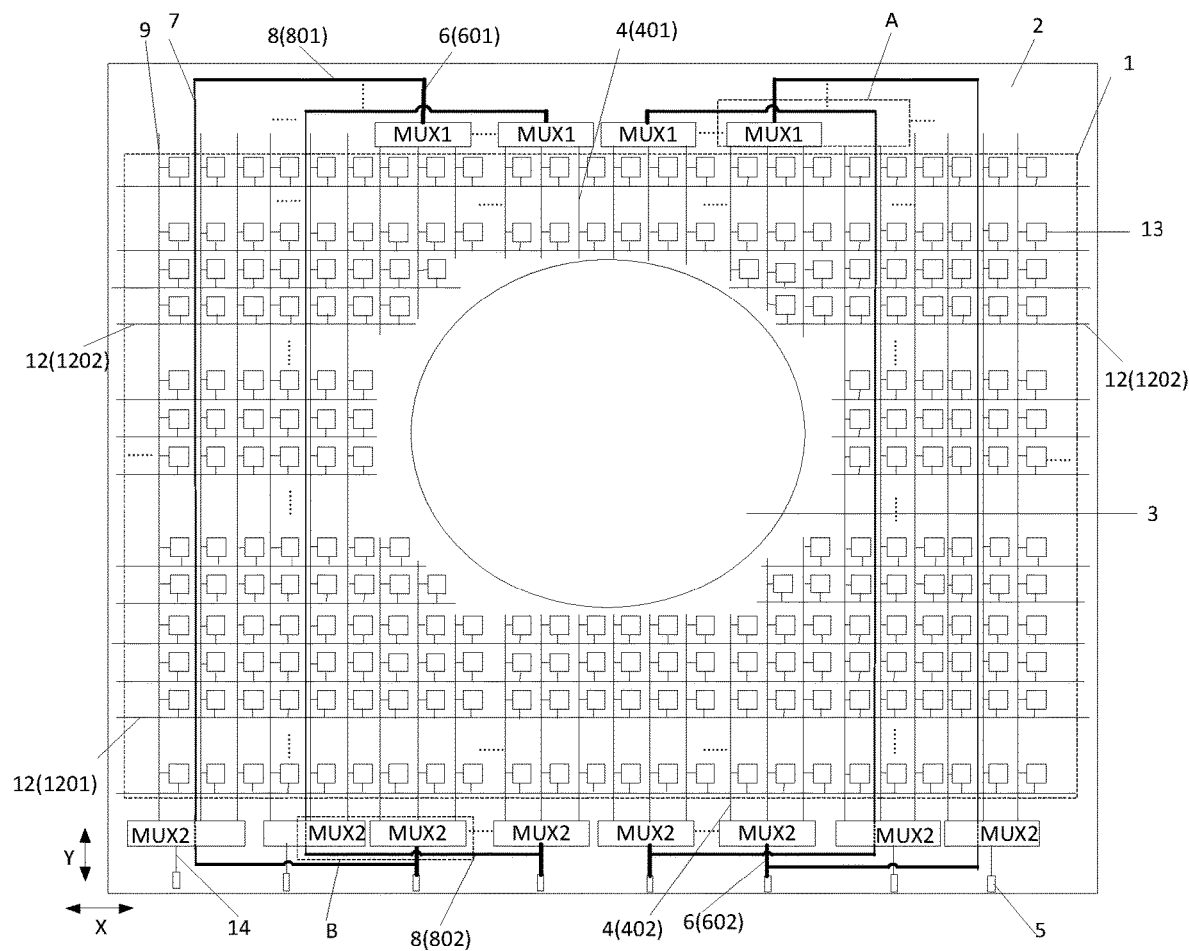
FIG. 2 is a structural schematic diagram of another display panel according to an embodiment of the disclosure.
Figure 5:
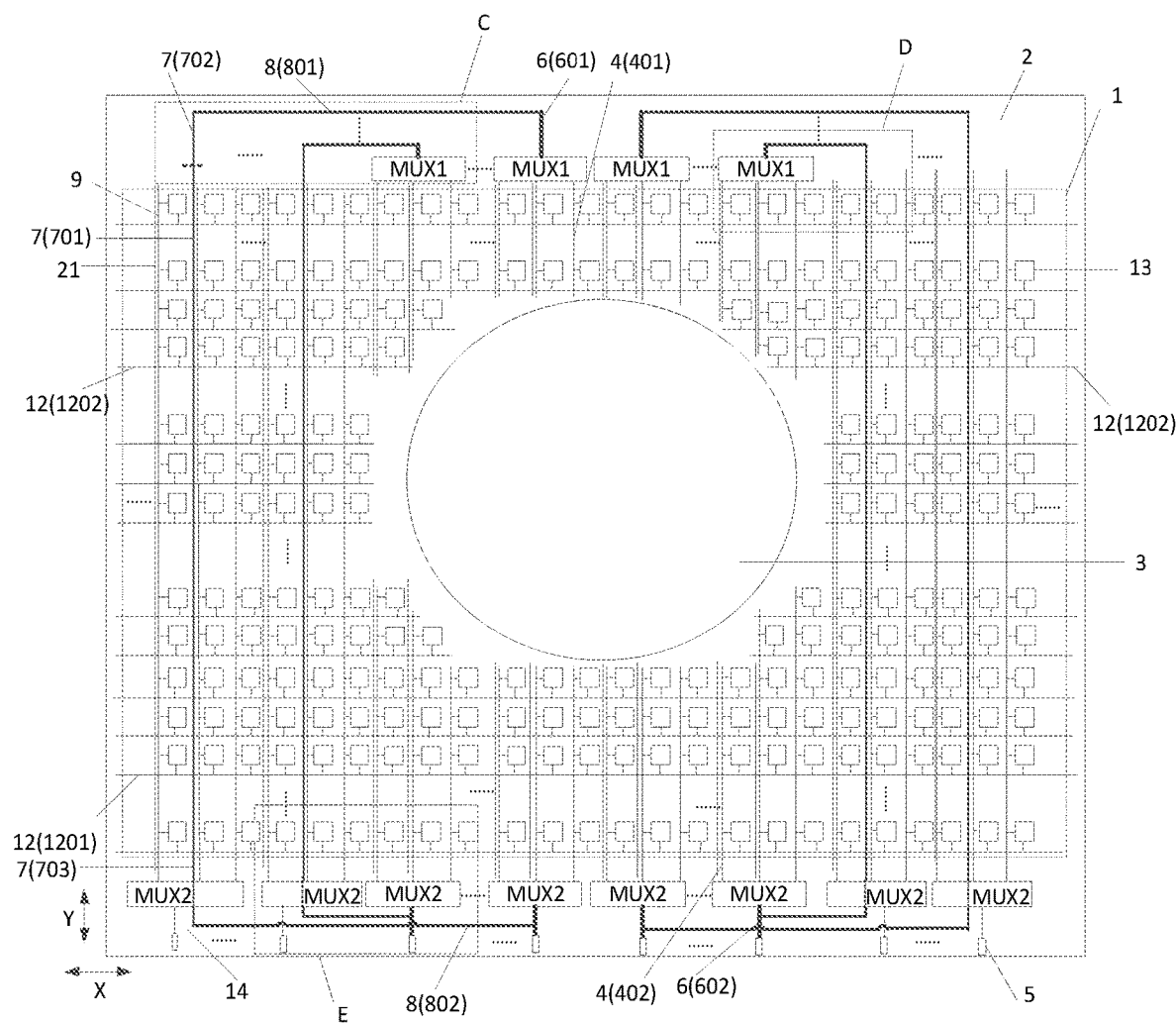
FIG. 5 is a structural schematic diagram of yet another display panel according to an embodiment of the disclosure.

Alternatively, during specific implementation, data signals may be provided to the first sub-data selection data line and the second sub-data selection data line in the same first data selection data line through the same data signal input terminal. In some embodiments, as shown in FIGS. 2 and 5, the first sub-data selection data line 601 and the second sub-data selection data line 602 included in the first data selection data line 6 are electrically connected with a same data signal input terminal 5.

The second connection leads 8 include: a plurality of first sub-connection leads 801 and a plurality of second sub-connection leads 802 located in the peripheral area 2 and extending in the first direction X.

The first sub-connection leads 801 are electrically connected with the first sub-data selection data lines 601 and the first connection leads 7 in the peripheral area 2 on the side of the second data selectors MUX1 away from the opening area 3.

The second sub-connection leads 802 are electrically connected with the second sub-data selection data lines 602 and the first connection leads 7 in the peripheral area 2 on the side of the second data selectors MUX2 away from the opening area 3.

That is, the data signals are provided to the first sub-data selection data line and the second sub-data selection data line in the same first data selection data line through the same data signal input terminal. In the display panel according to embodiments of the disclosure, since each first connection lead is electrically connected with both the first sub-data selection data line and the second sub-data selection data line in the same first data selection data line, that is, the data signals are provided to the first sub-data selection data line and the second sub-data selection data line in the same first data selection data line through the same data signal input terminal, the data signals can be written into the pixels on both sides of the opening area without adding an additional data signal input terminal or changing the algorithm of the drive chip to provide data signals, thus simplifying the design and fabrication difficulty of the display panel and also saving the cost.

In some embodiments, as shown in FIGS. 2 and 5, orthographic projections of the plurality of second connection leads 8 on the plane where the display panel is located do not overlap with each other; and the plurality of second connection leads 8 are arranged in the same layer.

Figure 3:
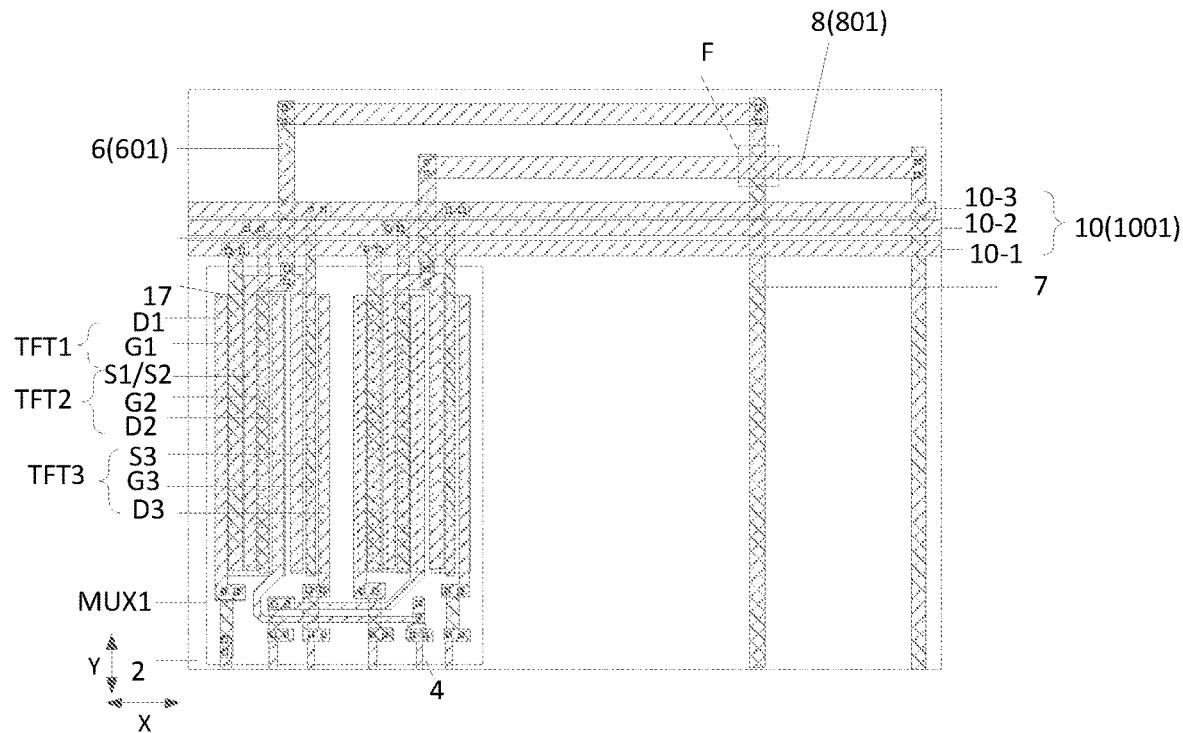
FIG. 3 is an enlarged schematic diagram of an area A in FIG. 2 according to an embodiment of the disclosure.
Figure 4:
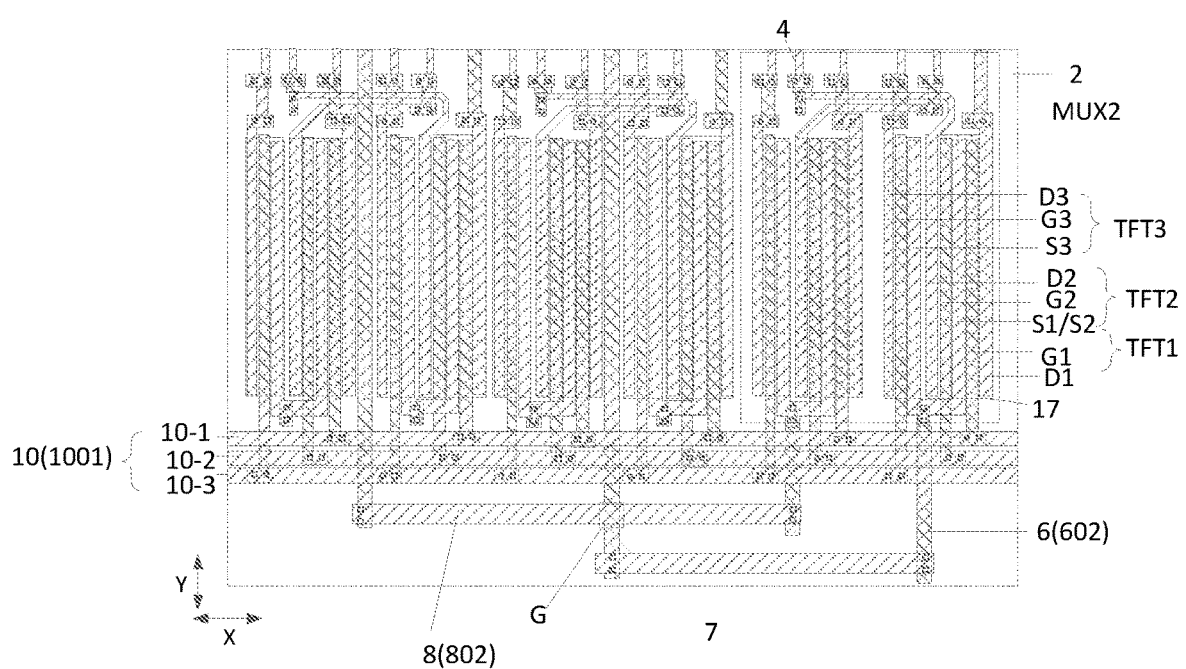
FIG. 4 is an enlarged schematic diagram of an area B in FIG. 2 according to an embodiment of the disclosure.

In some embodiments, as shown in FIGS. 2, 3 and 4, except for positions of electrical connections between the second connection leads 8 and the first connection leads 7 and positions of electrical connections between the second connection leads 8 and the first data selection data lines 6, the first connection leads 7 and the second connection leads 8 with overlapped orthographic projections on the plane where the display panel is located are located in different film layers. That is, as shown by the area F in FIG. 3, the first connection lead 7 and the second connection lead 8 are located in different film layers; and as shown by the area G in FIG. 4, the first connection lead 7 and the second connection lead 8 are located in different film layers. The first data selection data lines 6 and the second connection leads 8 with overlapped orthographic projections on the plane where the display panel is located are located in different film layers.

The lengths of the second connection leads 8 are equal in the peripheral area 2 located on a same side of the display area 1.

During specific implementation, the lengths of the second connection leads are equal in the peripheral area located on the same side of the display area, avoiding loads of the first leads and the first data selection data lines connected with the second connection leads from being consistent, and avoiding the display discrepancy.

During specific implementation, when the lengths of the second connection leads are equal, the first connection leads and the second connection leads with overlapped orthographic projections on the plane where the display panel is located are located in different film layers, and the first data selection data lines and the second connection leads with overlapped orthographic projections on the plane where the display panel is located are located in different film layers, to ensure the normal transmission of data signals. During specific implementation, FIG. 3 is an enlarged schematic diagram of the area A in FIG. 2, and FIG. 4 is an enlarged schematic diagram of the area B in FIG. 2. As shown in FIGS. 3 and 4, the second connection lead 8 and the first data line 4 are arranged in the same layer, and the first data selection data line 6 and the first connection lead 7 both include parts located below the layer where the second connection lead is located, that is, the area F in FIG. 3 and the area G in FIG. 4. The first data selection data line 6 is located below the layer where the second connection lead is located. Optionally, the first data selection data line 6 and the first connection lead 7 may also include parts located above the layer where the second connection lead is located, that is, the first data selection data line 6 is located above the layer where the second connection lead is located.

Alternatively, in some embodiments, as shown in FIGS. 5, 7, 8 and 9, the length of the second connection lead 8 close to the display area 1 is less than the length of the second connection lead 8 away from the display area 1 in the peripheral area 2 located on the same side of the display area 1.

Except for positions of electrical connections between the second connection leads 8 and the first connection leads 7 and positions of electrical connections between the second connection leads 8 and the first sub-data selection data lines 601, the orthographic projections of the second connection leads 8 on the plane where the display panel is located do not overlap with the orthographic projections of the first connection leads 7 on the plane where the display panel is located, and the orthographic projections of the second connection leads 8 on the plane where the display panel is located do not overlap with the orthographic projections of the first sub-data selection data lines 601 on the plane where the display panel is located.

In the display panel according to embodiments of the disclosure, the length of the second connection lead gradually increases in the direction away from the display area, and the first connection lead, the second connection lead and the first sub-data selection data line electrically connected on the outside surround the first connection lead, the second connection lead and the first sub-data selection data line electrically connected on the inside, so that there is no overlap between the second connection lead and the first connection lead not electrically connected therewith, and there is no overlap between the second connection lead and the first sub-data selection data line not electrically connected therewith. The second connection lead can be arranged in the same layer as at least part of the first connection lead, and the second connection lead can be arranged in the same layer as at least part of the first sub-data selection data line. The process is simple and easy to implement. For example, the second connection lead may be arranged in the same layer as the first connection lead at the connection position, and the second connection lead may be arranged in the same layer as the first data sub-selection data line at the connection position.

Figure 7:
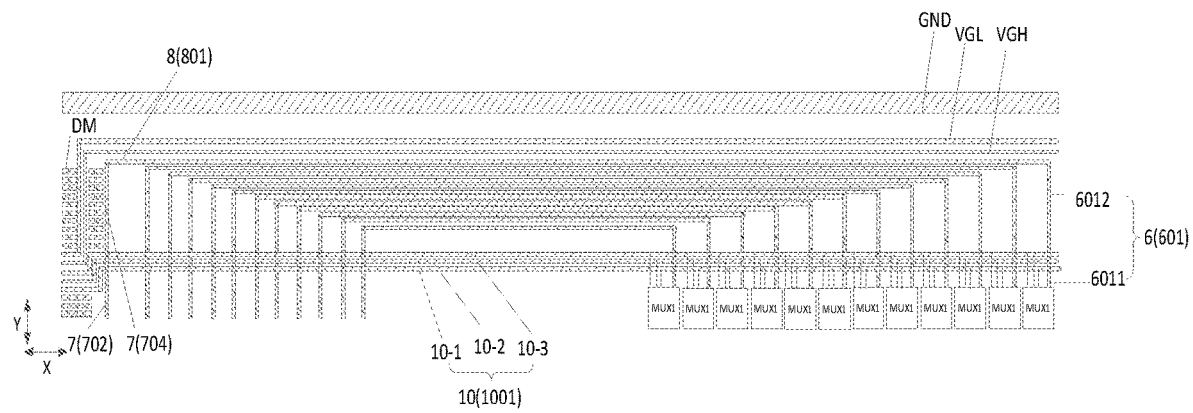
FIG. 7 is an enlarged schematic diagram of an area C in FIG. 5 according to an embodiment of the disclosure.
Figure 8:
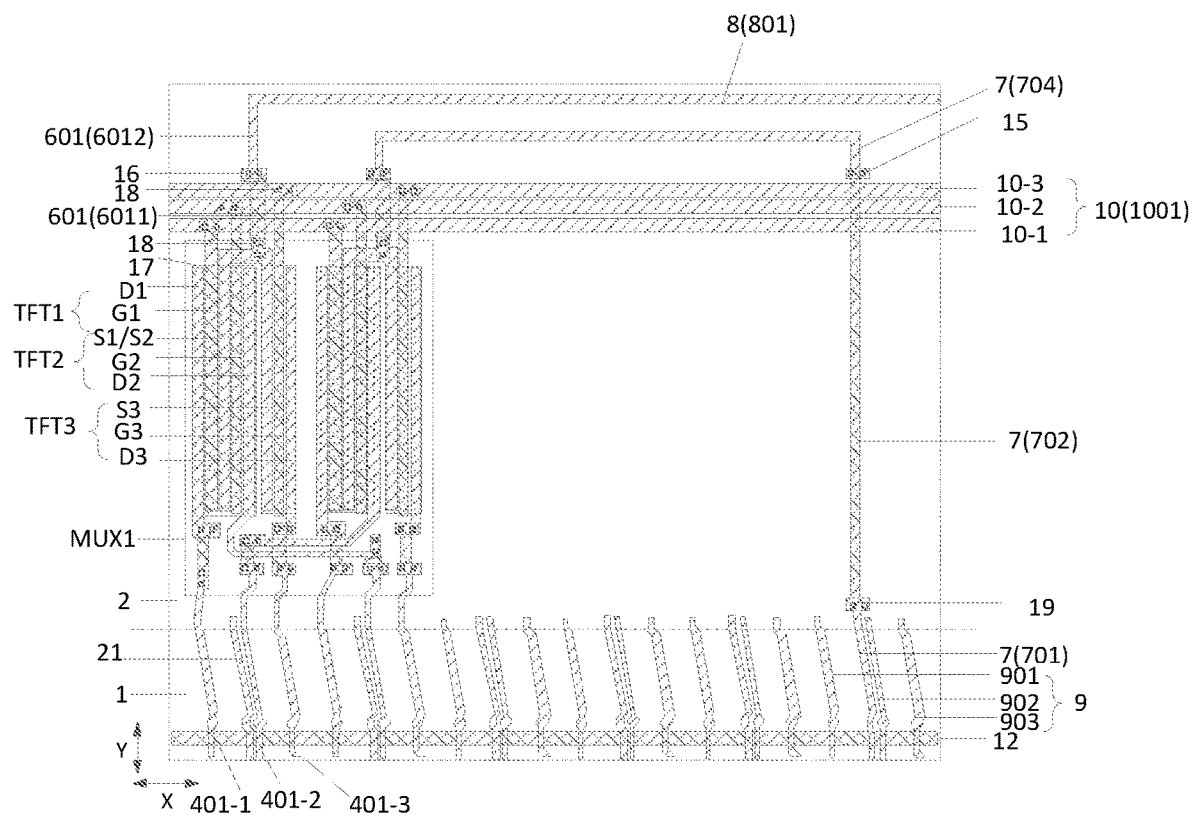
FIG. 8 is an enlarged schematic diagram of an area D in FIG. 5 according to an embodiment of the disclosure.
Figure 9:
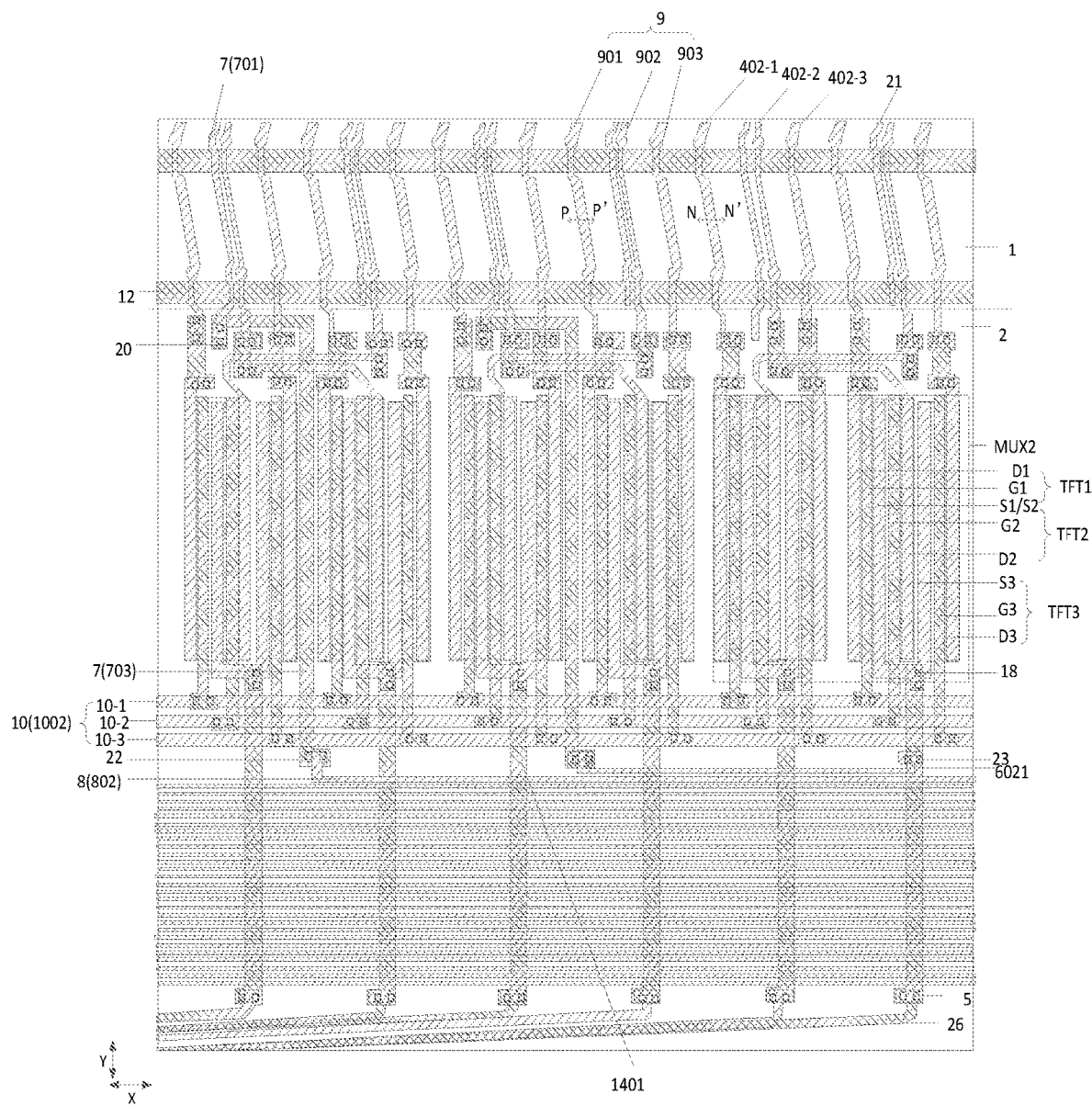
FIG. 9 is an enlarged schematic diagram of an area E in FIG. 5 according to an embodiment of the disclosure.

It should be noted that FIG. 7 is an enlarged schematic diagram of the area C in FIG. 5, FIG. 8 is an enlarged schematic diagram of the area D in FIG. 5, and FIG. 9 is an enlarged schematic diagram of the area E in FIG. 5. Due to limited space in the drawing, FIG. 7 only briefly illustrates the connection relationship between the first data selector MUX1 and various signal lines but does not show the specific structure of the data selector MUX.

During specific implementation, the display panel according to embodiments of the disclosure may be, for example, an electroluminescent display panel. The sub-pixel unit includes a thin film transistor pixel circuit and an electroluminescent device electrically connected with the thin film transistor pixel circuit. The electroluminescent device may be a quantum dot device or an organic light-emitting diode device. The display panel includes: a base substrate, and an active layer, a gate insulating layer, a first conductive layer, a first interlayer insulating layer, a second conductive layer, a second interlayer insulating layer, a third conductive layer, a protective layer, a fourth conductive layer, a planarization layer, an anode layer, a light-emitting functional layer and a cathode layer on the base substrate. The active layer may include, for example, a semiconductor layer of a thin film transistor, and a source-drain contact layer. The first conductive layer may include, for example, a gate of the thin film transistor, a first electrode of a capacitor, and a scan line. The second conductive layer may include, for example, a second electrode of the capacitor. The third conductive layer may include, for example, a source and a drain of the thin film transistor. The fourth conductive layer may include, for example, a lead electrically connected with the source. During specific implementation, the third conductive layer may also include at least a first data line and a second data line. Of course, the fourth conductive layer may also include at least a first data line and a second data line, that is, the first data line and the second data line are arranged in the same layer. It should be noted that FIGS. 8 and 9 do not show the complete thin film transistor, electroluminescent device and other structures in the sub-pixel unit.

Figure 6:
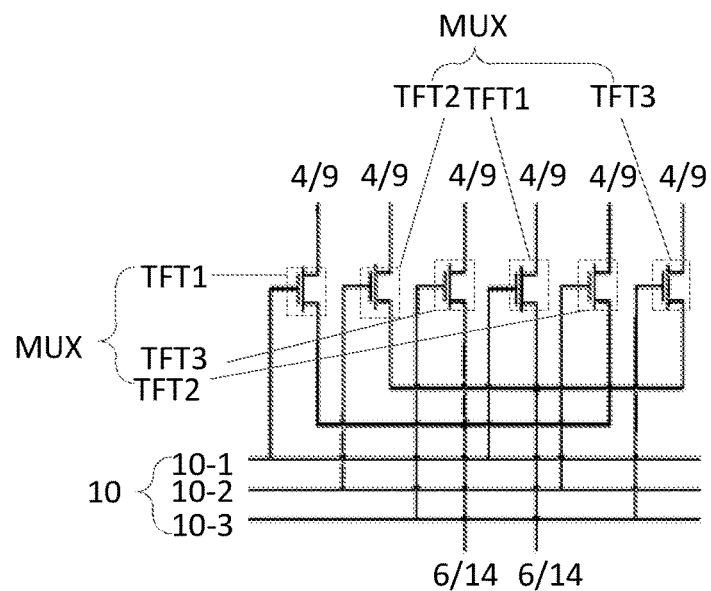
FIG. 6 is a structural schematic diagram of a data selector according to an embodiment of the disclosure.

In some embodiments, as shown in FIG. 6, the data selector MUX includes: a first transistor TFT1, a second transistor TFT2 and a third transistor TFT3. The display panel further includes: a plurality of data selection control signal lines 10, including: a first sub-data selection control signal line 10-1 electrically connected with the gate of the first transistor TFT1, a second sub-data selection control signal line 10-2 electrically connected with the gate of the second transistor TFT2, and a third sub-data selection control signal line 10-3 electrically connected with the gate of the third transistor TFT3. In a data selector electrically connected with a first data selection data line 6, the sources of the first transistor TFT1, the second transistor TFT2 and the third transistor TFT3 are electrically connected with the first data selection data line 6; and in this data selector, the drains of the first transistor TFT1, the second transistor TFT2 and the third transistor TFT3 are electrically connected with different first data lines 4 respectively. In a data selector electrically connected with a second data selection data line 14, the sources of the first transistor TFT1, the second transistor TFT2 and the third transistor TFT3 are electrically connected with the second data selection data line 14; and in this data selector, the drains of the first transistor TFT1, the second transistor TFT2 and the third transistor TFT3 are electrically connected with different second data lines 9 respectively.

In some embodiments, as shown in FIGS. 6, 8, and 9, the plurality of data selection control signal lines 10 are located in the peripheral area 2 and include parts extending in the first direction X; and the plurality of data selection control signal lines 10 include: a plurality of first data selection control signal lines 1001 electrically connected with the first data selectors MUX1, a plurality of second data selection control signal lines 1002 electrically connected with the second data selectors MUX2, and a plurality of third data selection control signal lines 1003 electrically connected with the third data selectors MUX3.

During specific implementation, the sub-pixel columns include, for example, a red sub-pixel column, a blue sub-pixel column and a green sub-pixel column. The first transistor TFT1, the second transistor TFT2 and the third transistor TFT3 are electrically connected with the data lines corresponding to the red sub-pixel column, the blue sub-pixel column and the green sub-pixel column, respectively.

During specific implementation, as shown in FIG. 7, the peripheral area further includes: a ground potential signal line GND, a high-level signal line VGH, a low-level signal line VGL and an electrostatic discharge unit. The low-level signal line VGL is located between the ground potential signal line GND and the high-level signal line VGH, the first sub-connection lead is located between the high-level signal line VGH and the data selection control signal line 10, and an electrostatic discharge unit includes a plurality of dummy electrode blocks DM. Each of the data selection control signal line 10, the high-level signal line VGH and the low-level signal line VGL includes a part extending in the first direction X and a part extending in the second direction Y. In FIG. 7, the dummy electrode blocks DM are arranged on the side of the part of the low-level signal line VGL extending in the second direction Y away from the first connection lead 7, between the part of the high-level signal line VGH extending in the second direction Y and the part of the data selection control signal line 10 extending in the second direction Y, and on the side of the part of the data selection control signal line 10 extending in the first direction X away from the high-level signal line VGH.

It should be noted that, in the related art, the low-level signal line VGL is adjacent to the high-level signal line VGH in the area where the second connection leads 8 are arranged, except for positions shown by the dummy electrode blocks DM shown in FIG. 7, in the peripheral area on a side of the opening area away from the data signal input terminals. A plurality of dummy electrode blocks may also be arranged as electrostatic discharge units and dummy electrode blocks between the part of the ground potential signal line GND extending in the first direction X and the part of the low-level signal line VGL extending in the first direction X, and between the part of the low-level signal line VGL extending in the first direction X and the part of the data selection control signal line 10 extending in the first direction X. That is to say, in the display panel according to embodiments of the disclosure, for the non-display area on the side of the opening area away from the data signal input terminal, the second connection lead is disposed between the high-level signal line VGH and the data selection control signal line, equivalent to using the area where the original dummy electrode block is arranged to arrange the second connection lead and the part of the first connection lead electrically connected with the second connection lead in the peripheral area, avoiding the increased size of the peripheral area while avoiding the black edges in the opening area.

In some embodiments, as shown in FIGS. 7, 8, and 9, the second connection leads 8 are located on the side of the data selection control signal lines 10 away from the display area 1.

The first connection lead 7 includes: a first part 701, and a second part 702 and a third part 703 respectively connected with the first part 701 on both sides of the first part 701 in the second direction Y. The second part 702 is located on a side of the first part 701 away from the data signal input terminal, and the third part 703 is located on a side of the first part 701 close to the data signal input terminal.

The orthographic projection of the first part 701 on the plane where the display panel is located does not overlap with the orthographic projections of the data selection control signal lines 10 on the plane where the display panel is located, the orthographic projection of the second part 702 on the plane where the display panel is located overlaps with the orthographic projections of the first data selection control signal lines 1001 on the plane where the display panel is located, and the orthographic projection of the third part 703 on the plane where the display panel is located overlaps with the orthographic projections of the second data selection control signal lines 1002 on the plane where the display panel is located.

The data selection control signal lines 10 and the second data lines 9 are arranged in a same layer; the first part 701 and the second data lines 9 are arranged in a same layer and adjacent. The second part 702 and the third part 703 are arranged in a same layer and located in a different layer from the first part 701.

In the display panel according to embodiments of the disclosure, the second connection lead is located on the side of the data selection control signal line away from the display area. That is, as shown in FIG. 8, the first sub-connection lead 801 is located on the side of the data selection control signal line 10 electrically connected with the first data selector MUX1 away from the display area 1. As shown in FIG. 9, the second sub-connection lead 802 is located on the side of the data selection control signal line 10 electrically connected with the second data selector MUX2 away from the display area 1. Therefore, the first connection lead needs to pass through the data selection control signal line 10 electrically connected with the first data selector MUX1 to be electrically connected with the first sub-connection lead 801, and the first connection lead needs to pass through the data selection control signal line 10 electrically connected with the second data selector MUX2 to be electrically connected with the second sub-connection lead 802. When the data selection control signal line and the second data line are arranged in the same layer, the first part of the first connection lead adjacent to the second data line is arranged in the same layer as the second data line, and the second part and third part extending to the peripheral area and having orthographic projections overlapping with the orthographic projection of the data selection control signal line are located on a different layer from the second data line, so that the data signal can be transmitted by the first connection lead while avoiding the data selection control signal line, ensuring the transmission of the data signal.

In some embodiments, as shown in FIG. 8 and FIG. 9, the source S1 and the drain D1 of the first transistor TFT1, the source S2 and the drain D2 of the second transistor TFT2, and the source S3 and drain D3 of the third transistor TFT3 are arranged in the same layer as the data selection control signal line 10; the gate G1 of the first transistor TFT1, the gate G of the second transistor TFT2, and the gate G3 of the third transistor TFT3 are arranged in the same layer as the scan line 12; and the first transistor TFT1, the second transistor TFT2 and the third transistor TFT3 also include an active layer 17. In FIGS. 8 and 9, the gate G is located between the active layer 17 and the source S and drain D, that is, the first transistor TFT1, the second transistor TFT2 and the third transistor TFT3 have a top-gate structure. Of course, during specific implementation, the first transistor TFT1, the second transistor TFT2 and the third transistor TFT3 also have a bottom-gate structure.

In some embodiments, as shown in FIGS. 8 and 9, the second transistor TFT2 located between the first transistor TFT1 and the third transistor TFT3 belongs to a different data selector than the first transistor TFT1 and the third transistor TFT3 in the first direction.

In some embodiments, as shown in FIGS. 8 and 9, the second connection leads 8 and the data selection control signal lines 10 are arranged in the same layer.

That is, during specific implementation, as shown in FIGS. 8 and 9, the first part 701, the second connection lead 8, the data selection control signal line 10, the first data line 4 and the second data line 9 are arranged in the same layer, and the above film layer may be located in the third conductive layer or the fourth conductive layer. During specific implementation, as shown in FIGS. 8 and 9, the second part 702 and the third part 703 of the first connection lead 7 may be arranged in the same layer as the scan line 12, that is, the above film layer may be located in the first conductive layer.

In some embodiments, as shown in FIG. 8, the first connection lead 7 further includes: a thirteenth part 704 electrically connected with the second part 702 and the first sub-connection lead 801. The thirteenth part 704 and the second part 702 are located in different layers, and the thirteenth part 704 and the first sub-connection lead 801 are arranged in the same layer. In the direction perpendicular to the plane where the display panel is located, the display panel further includes an insulating film layer located between the second connection lead 8 and the second part 702; the thirteenth part 704 is connected with the second part 702 through the first via hole 15 penetrating the insulating film layer; and the second part 702 is electrically connected with the first part 701 through the sixth via hole 19 penetrating the insulating film layer.

As shown in FIG. 9, the second sub-connection lead 802 is connected with the third part 703 through the second via hole 22 penetrating the insulating film layer; and the third part 703 is electrically connected with the first part 701 through the seventh via hole 20 penetrating the insulating film layer.

During specific implementation, when the second connection lead is located in the third conductive layer and the first part is located in the first conductive layer, the first via hole and the second via hole penetrate the second interlayer insulating layer and the first interlayer insulating layer. Alternatively, when the second connection lead is located in the fourth conductive layer and the first part is located in the first conductive layer, the first via hole and the second via hole penetrate the protective layer, the second interlayer insulating layer and the first interlayer insulating layer.

In some embodiments, as shown in FIG. 8, the first sub-data selection data line 601 includes: a fourth portion 6011 located in a different layer from the data selection control signal line 10.

As shown in FIG. 9, the data signal input terminal 5 is located on the side of the data selection control signal line 10 electrically connected with the second data selector MUX2 away from the display area 1; and the second sub-data selection data line 602 includes: a fifth part 6021 located in a different layer from the data selection control signal line 10.

The orthographic projection of the fourth part 6011 on the plane where the display panel is located overlaps with the orthographic projection of the data selection control signal line 10 on the plane where the display panel is located, and the orthographic projection of the fifth part 6021 on the plane where the display panel is located overlaps with the orthographic projection of the data selection control signal line 10 on the plane where the display panel is located.

During specific implementation, the second connection lead is located on the side of the data selection control signal line away from the display area, that is, as shown in FIG. 8, the first sub-connection lead 801 is located on the side of the data selection control signal line 10 electrically connected with the first data selector MUX1 away from the display area 1; and the data signal input terminal is located on the side of the data selection control signal line away from the display area 1. As shown in FIG. 9, the data signal input terminal 5 is located on the side of the data selection control signal line 10 electrically connected with the second data selector MUX2 away from the display area 1. Therefore, the fourth part 6011 included in the first sub-data selection data line 601 needs to pass through the data selection control signal line 10 electrically connected with the first data selector MUX1 to be electrically connected with the first sub-connection lead 801, and the fifth part 6021 included in the second sub-data selection data line 602 needs to pass through the data selection control signal line 10 electrically connected with the second data selector MUX2 to be electrically connected with the data signal input terminal 5. The fourth part and the fifth part are located on different layers from the data selection control signal line, so that the electrical connection between the first sub-data selection data line and the second connection lead can avoid the data selection control signal line, and the electrical connection between the second sub-data selection data line and the data signal input terminal can avoid the data selection control signal line, to ensure the transmission of the data signal.

In some embodiments, as shown in FIGS. 8 and 9, the fourth part 6011 and the fifth part 6021 extend in the second direction Y.

As shown in FIG. 8, the first sub-data selection data line 601 further includes: a fifteenth part 6012 electrically connected with the first sub-connection lead 801 and the fourth part 6011. The fifteenth part 6012 and the first sub-connection lead 801 are arranged in the same layer, and the fifteenth part 6012 and the fourth part 6011 are located in different layers. The fifteenth part 6012 is electrically connected with the fourth part 6011 through the third via hole 16 penetrating the insulating film layer. The fifteenth part 6012 is electrically connected with the source S1 of the first transistor TFT1, the source S2 of the second transistor TFT2, and the source S3 of the third transistor TFT3 through the fourth via hole 18 penetrating the insulating film layer.

As shown in FIG. 9, the second sub-connection lead 802 is electrically connected with the fifth part 6021 through the fifth via hole 23 penetrating the insulating film layer; and the fifth part 6021 is also electrically connected with the data signal terminal 5.

In some embodiments, as shown in FIG. 9, the second data selection data line 14 includes a sixth portion 1401 located in a different layer from the second data line 9.

In the display panel according to embodiments of the disclosure, when the first data line is disconnected in the opening area, the first sub-data line located on a side of the opening area is electrically connected with the data signal input terminal through the data selector, the first sub-data selection data line and the second connection lead and first connection lead located outside the opening area, the first connection lead, the second connection lead and all parts of each data selection signal line can be fabricated at the same time as the scan line or data line, so that there is no need to increase the patterning process of leads or signal lines, and the fabrication process of the display panel will not be increased.

In some embodiments, as shown in FIG. 9, the display panel further includes first signal lines 26 electrically connected with the data signal input terminals 5. The first signal line 26 is, for example, electrically connected with a drive chip, so that the drive chip provides a data signal to the data signal input terminal 5 through the first signal line 26.

In some embodiments, as shown in FIGS. 5 and 8 to 9, the display panel further includes a plurality of dummy signal lines 21 extending in the second direction Y. As shown in FIG. 5, some of the dummy signal lines 21 are disconnected in the opening area 3.

At least some of the first data lines 4 are adjacent to the dummy signal lines 21, and at least some of the second data lines 9 not adjacent to the first connection leads 7 are adjacent to the dummy signal lines 21.

During specific implementation, as shown in FIGS. 5 and 8, for a dummy signal line 21 adjacent to a first data line 4, the dummy signal line 21 is adjacent to the first data line 4 on the left side of the first data line 4. As shown in FIGS. 5 and 9, for a dummy signal line 21 adjacent to a second data line 9, the dummy signal line 21 is adjacent to the second data line 9 on the left side of the second data line 9.

That is, during specific implementation, for the dummy signal line adjacent to the first data line, the dummy signal line is located in the area between the first data line and the sub-pixel column, and the sub-pixel column is adjacent to and not electrically connected with the first data line. For the dummy signal line adjacent to the second data line, the dummy signal line is located in the area between the second data line and the sub-pixel column, and the sub-pixel column is adjacent to and not electrically connected with the second data line.

During specific implementation, as shown in FIG. 5, the dummy signal lines 21 adjacent to the first data lines 4 are disconnected in the opening area 3.

In some embodiments, as shown in FIGS. 8 and 9, in each data selector MUX, the source S1 of the first transistor TFT1, the source S2 of the second transistor TFT2, and the source S3 of the third transistor TFT3 are all electrically connected with the same first data selection data line 6 or the same second data selection data line 14.

In each data selector MUX, the drain D1 of the first transistor TFT1, the drain D2 of the second transistor TFT2, and the drain D3 of the third transistor TFT3 are electrically connected with different first data lines 4 or different second data lines 9 respectively.

The first data line 401-2/402-2 electrically connected with the drain D2 of the second transistor TFT2 is adjacent to the dummy signal line 21; and the second data line 902 electrically connected with the drain D2 of the second transistor TFT2 is adjacent to one of the first connection lead 7 or the dummy signal line 21.

During specific implementation, the arrangement of the dummy signal lines is for purpose of improving the display uniformity. When the display panel is working, there is no need to provide signals to the dummy signal lines, that is, the dummy signal lines do not need to transmit the same signals as the first connection leads.

It should be noted that some second data lines 902 electrically connected with the drain D2 of the second transistor TFT2 need to be adjacent to the first connection leads 7, so that other second data lines 902 electrically connected with the drain D2 of the second transistor TFT2 are adjacent to the dummy signal lines 21, and the first data line 402-1/402-2 electrically connected with the drain D2 of the second transistor TFT2 is adjacent to the dummy signal line 21. That is, the second data lines or the first data lines electrically connected with the drain D2 of the second transistor TFT2 are all adjacent to other signal lines, thus improving the display uniformity.

In some embodiments, as shown in FIGS. 8 and 9, the first data line 401-1/402-1 electrically connected with the drain D1 of the first transistor TFT1 is not adjacent to the dummy signal line 21. The second data line 901 electrically connected with the drain D1 of the transistor TFT1 is not adjacent to the first connection lead 7 or the dummy signal line 21.

The first data line 401-3/402-3 electrically connected with the drain D3 of the third transistor TFT3 is not electrically connected with the dummy signal line 21, and the second data line 903 electrically connected with the drain D3 of the third transistor TFT3 is not adjacent to the first connection lead 7 or the dummy signal line 21.

In the first direction X, the width of the first data line 401-1/402-1 electrically connected with the drain D1 of the first transistor TFT1 is greater than the width of the first data line 401-2/402-2 electrically connected with the drain D2 of the second transistor TFT2. A width of the second data line 903 electrically connected with the drain D1 of the first transistor TFT1 is greater than a width of the second data line 902 electrically connected with the drain D2 of the second transistor TFT2.

In the first direction X, a width of the first data line 401-3/402-3 electrically connected with the drain D3 of the third transistor TFT3 is greater than a width of the first data line 401-2/402-2 electrically connected with the drain D2 of the second transistor TFT2. A width of the second data line 903 electrically connected with the drain D3 of the third transistor TFT3 is greater than a width of the second data line 902 electrically connected with the drain D2 of the second transistor TFT2.

In some embodiments, in the first direction X, the width of the first data line 401-1/402-1 electrically connected with the drain D1 of the first transistor TFT1 is equal to the width of the first data line 401-3/402-3 electrically connected with the drain D3 of the third transistor TFT3. The width of the second data line 903 electrically connected with the drain D1 of the first transistor TFT1 is equal to the width of the second data line 903 electrically connected with the drain D3 of the third transistor TFT3.

It should be noted that the width of the first data line in the first direction X involved in embodiments of the disclosure refers to the line width of the first data line (for example, the width along the section NN' in FIG. 9). The width of the second data line in the first direction X involved in embodiments of the disclosure refers to the line width of the second data line (for example, the width along the section PP' in FIG. 9).

In the display panel according to embodiments of the disclosure, the first data line 402-1/402-2 is adjacent to the dummy signal line 21, the first data line 401-1/401-3//401-2/402-3 is not adjacent to the dummy signal line 21, the second data line 902 is adjacent to the first connection lead 7 or the dummy signal line 21, and the second data line 901/903 is adjacent to neither of the first connection lead 7 and the dummy signal line 21. The width of the first data line 401-1/402-1/401-3/402-3 is greater than the width of the remaining first data line 401-2/402-2, and the width of the second data line 901/903 is greater than the width of the remaining second data line 902, so that the total widths of various types of signal lines arranged between two adjacent columns of sub-pixels are proximate to each other, thus improving the display uniformity and improving the display effect.

In some embodiments, as shown in FIGS. 8 and 9, the dummy signal lines 21, the first data lines 4 and the second data lines 9 are arranged in the same layer.

In some embodiments, as shown in FIGS. 10 to 14, the display panel further includes: a plurality of touch signal lines 27 extending from the display area 1 to the peripheral area 2 in the second direction Y, and a plurality of touch signal input terminals 24. The touch signal input terminal 24 is located between two adjacent data signal input terminals 5.

Figure 10:
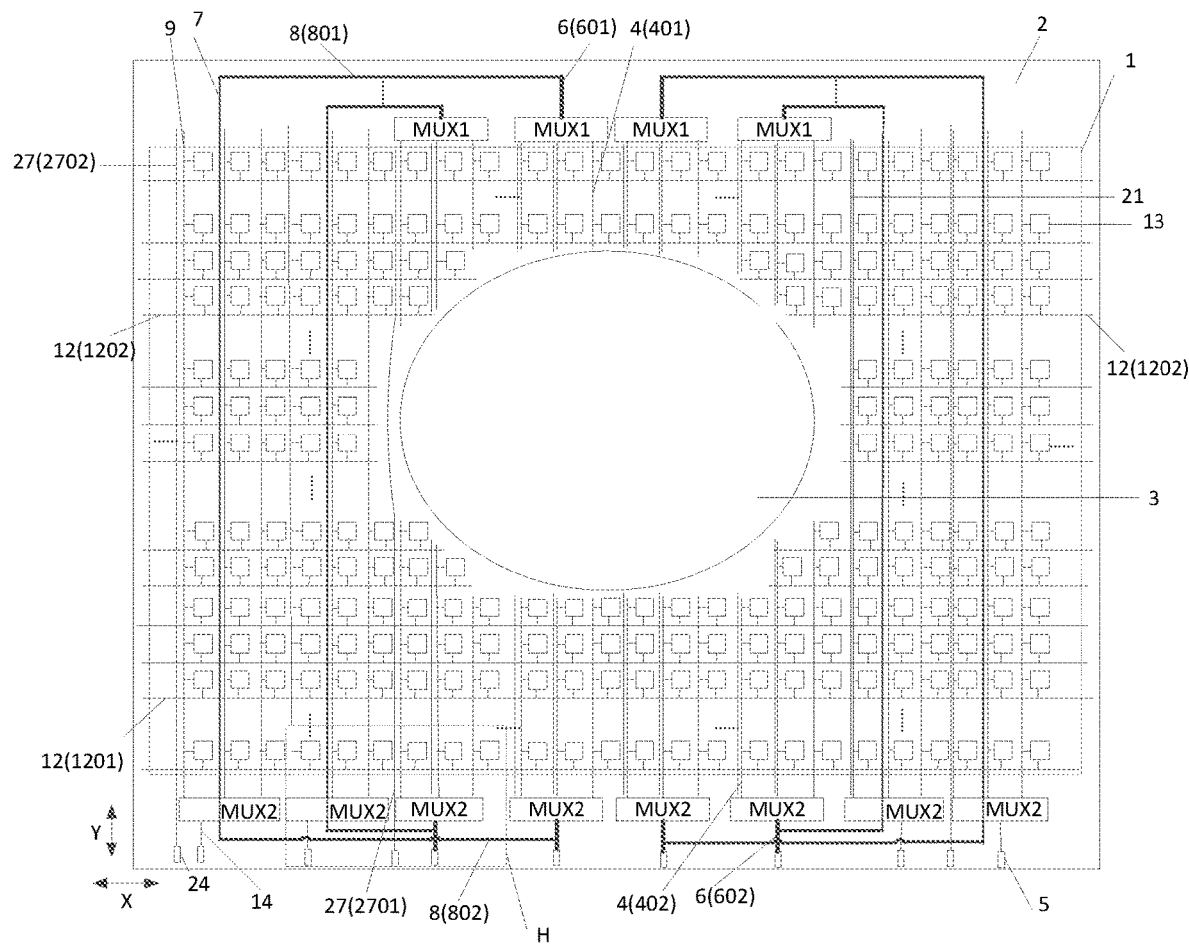
FIG. 10 is a structural schematic diagram of yet another display panel according to an embodiment of the disclosure.
Figure 11:
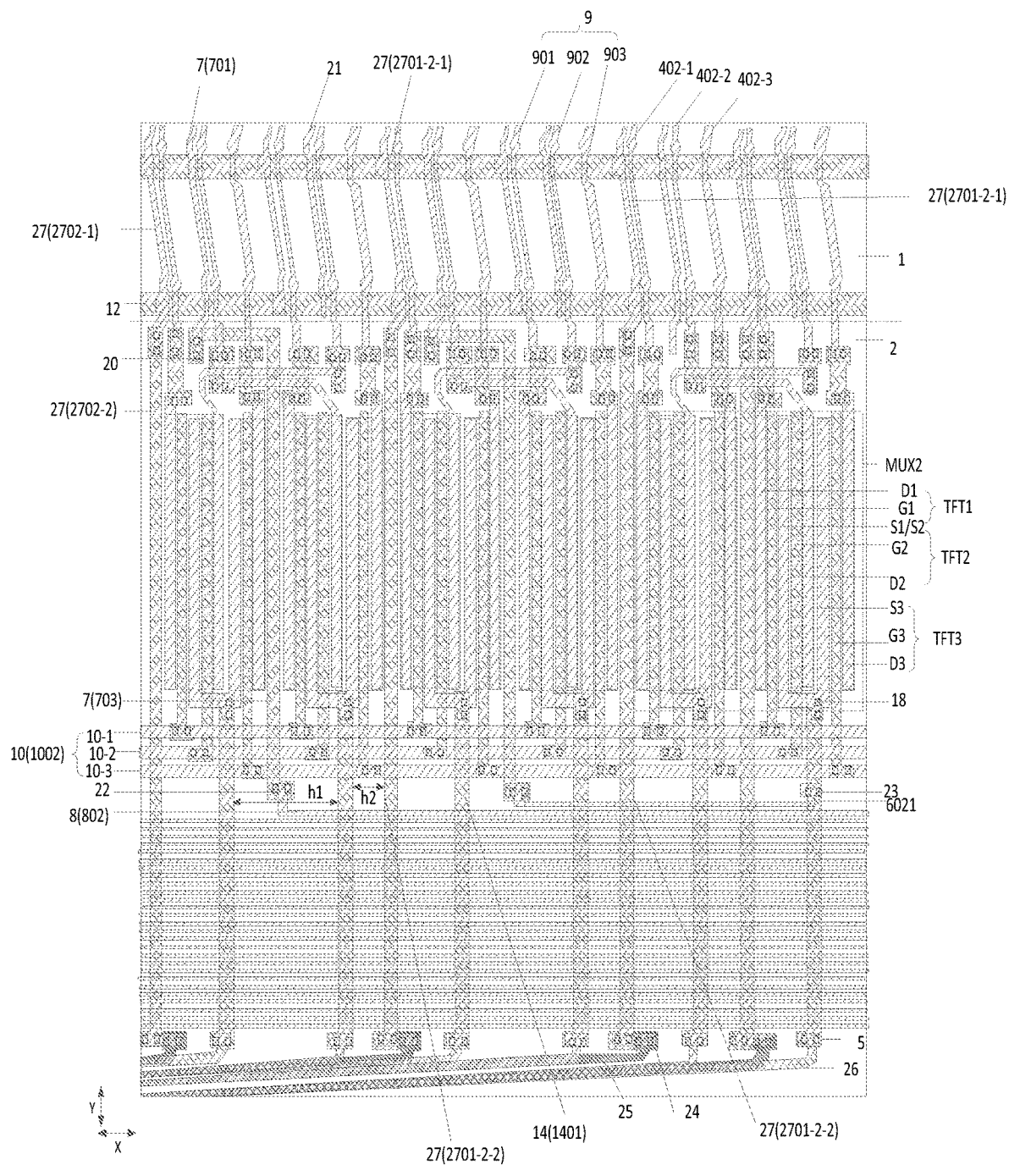
FIG. 11 is an enlarged schematic diagram of an area H in FIG. 10 according to an embodiment of the disclosure.
Figure 12:
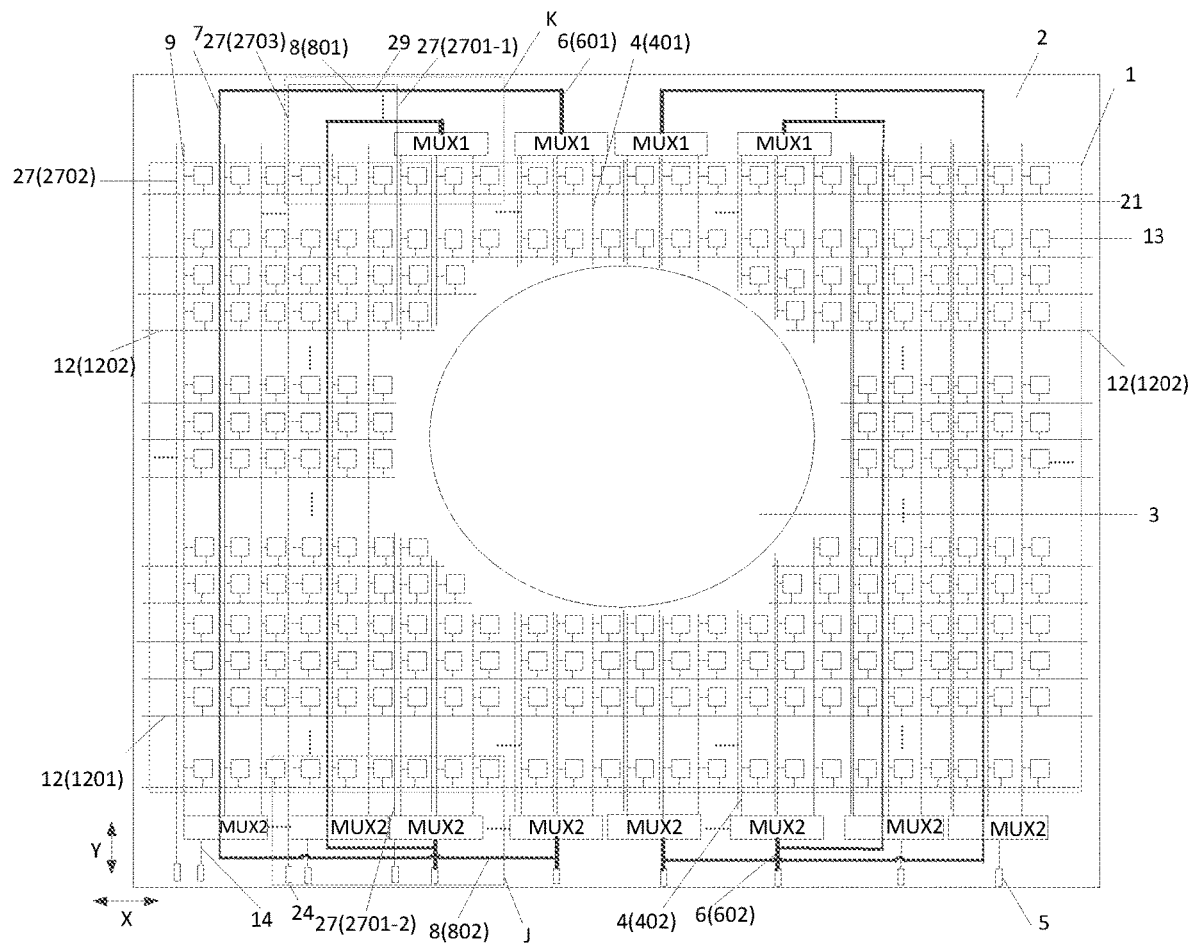
FIG. 12 is a structural schematic diagram of yet another display panel according to an embodiment of the disclosure.
Figure 13:
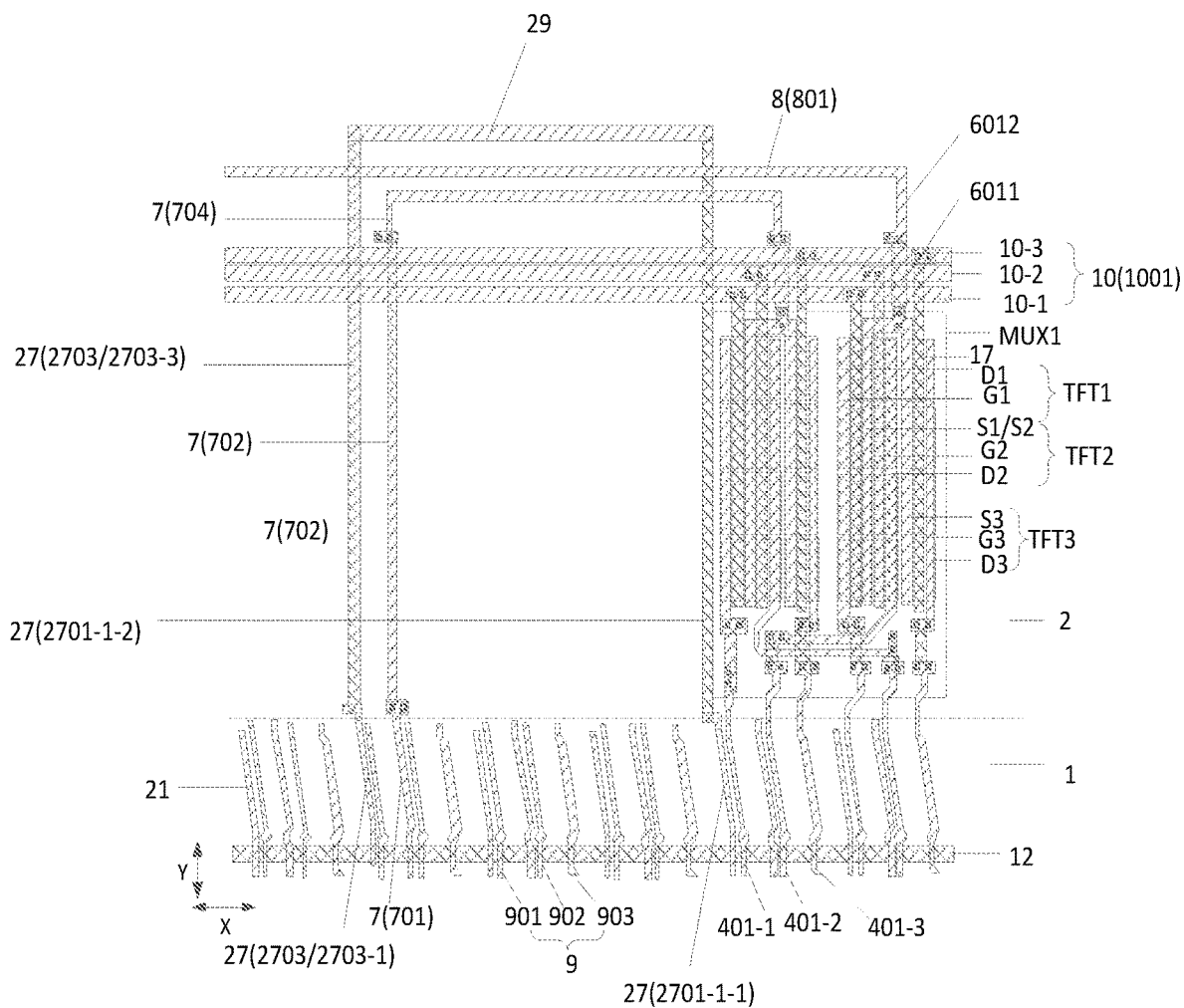
FIG. 13 is an enlarged schematic diagram of an area K in FIG. 12 according to an embodiment of the disclosure.
Figure 14:
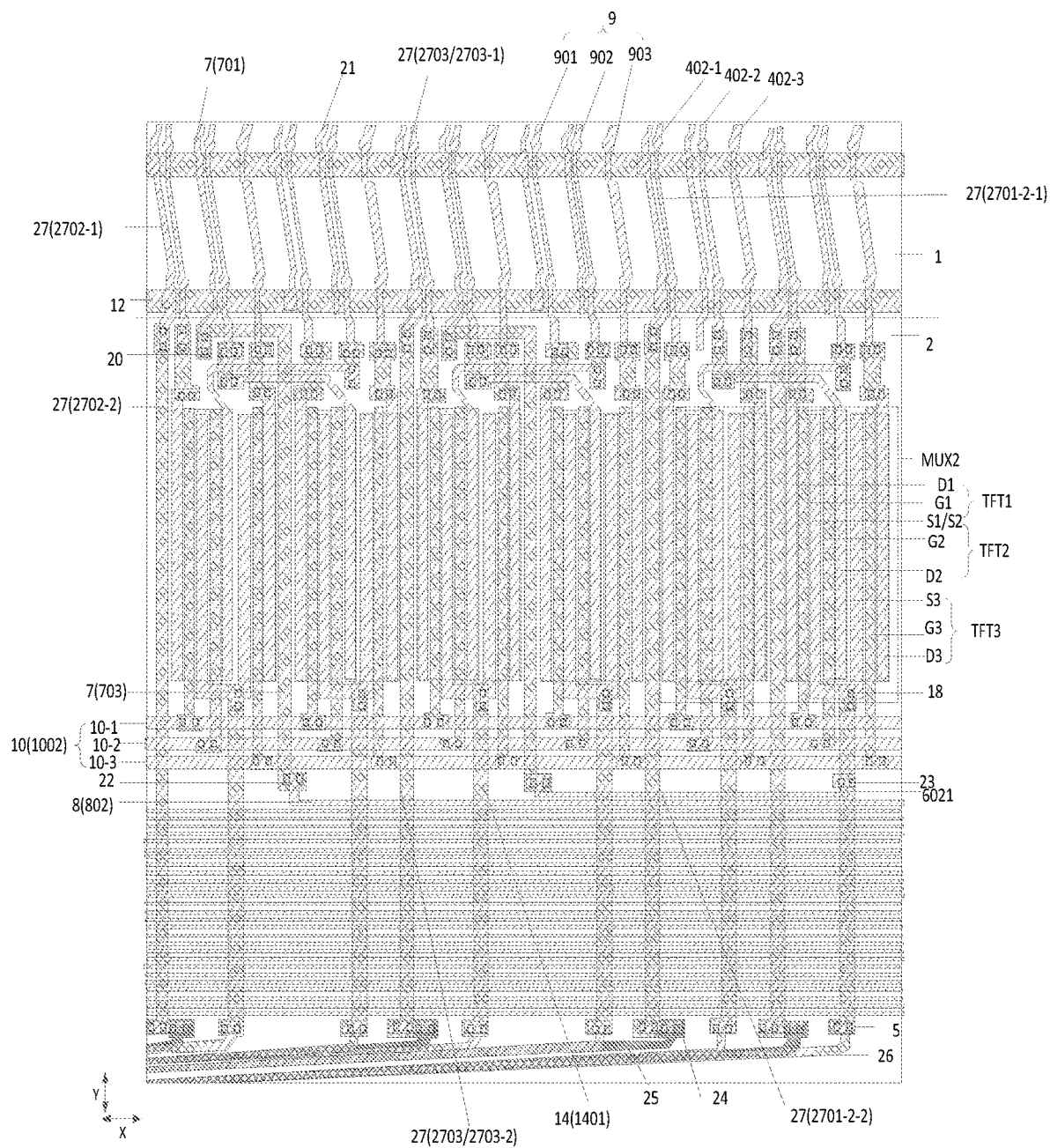
FIG. 14 is an enlarged schematic diagram of an area J in FIG. 12 according to an embodiment of the disclosure.

It should be noted that FIG. 11 is an enlarged schematic diagram of the area H in FIG. 10, FIG. 13 is an enlarged schematic diagram of the area K in FIG. 12, and FIG. 14 is an enlarged schematic diagram of the area J in FIG. 12.

In some embodiments, as shown in FIGS. 11 and 14, the display panel further includes: second signal lines 25 electrically connected with the touch signal input terminals 24. The second signal line 25 is, for example, electrically connected with a drive chip, so that the drive chip transmits the touch signal to the touch signal input terminal 24 through the second signal line 25.

That is, the display panel according to embodiments of the disclosure is a touch display panel. During specific implementation, when the display panel is an electroluminescent display panel, the side of the cathode away from the anode is also provided with an encapsulation layer, the side of the encapsulation layer away from the cathode also includes a touch module, the touch module includes a plurality of touch sensing electrodes and a plurality of touch driving electrodes, and the touch sensing electrodes and the touch driving electrodes are electrically connected with the touch signal input terminals through touch signal lines.

During specific implementation, the touch signal input terminal is located between two data signal input terminals, and the area of the display panel between two data signal input terminals can have enough wiring space to arrange the touch signal line, reducing the wiring difficulty of the touch signal line. During specific implementation, the data signal input terminals are arranged in the same layer as the data lines, the first signal lines are arranged in the same layer as the data lines or scan lines, the second signal lines and the first signal lines are located in different layers, and the orthographic projections of the second signal line and the first signal line in the direction parallel to the plane where the display panel is located may have an overlapping area, so as to save the wiring space and facilitate reducing the size of the peripheral area. The touch signal input terminal includes a part arranged in the same layer as the data signal input terminal and a part arranged in the same layer as the second signal line.

During specific implementation, FIG. 11 is taken as an example for illustration. In the first direction X, the orthographic projection of the third part 703 of the first connection lead 7 on the plane where the display panel is located is located in the area between the orthographic projections of two adjacent second data selection data lines 14 on the plane where the display panel is located. The width of the area between the orthographic projections of the two second data selection data lines 14 on the plane where the display panel is located is h1, and no touch signal input terminal 24 is arranged between the data signal input terminals 5 electrically connected with the two second data selection data lines 14, that is, there is no touch signal line 27 in the area between the orthographic projections of the two second data selection data lines 14 on the plane where the display panel is located. That is, h1 is greater than the width h2 between the adjacent second data selection data line 14 and touch signal line 27. The third part 703 of the first connection lead 7 is arranged in the area corresponding to h1 instead of the area corresponding to h2, so that there is enough wiring space to arrange the first connection lead 7, reducing the wiring difficulty of the first connection lead 7.

In some embodiments, as shown in FIG. 10, the plurality of touch signal lines 27 include: a plurality of first touch signal lines 2701 surrounding the opening area 3, and a plurality of second touch signal lines 2702 located outside the opening area 3 in the first direction X. That is, the first touch signal lines 2701 are wound around the opening area 3. It should be noted that the number of touch signal lines is much less than the number of data lines. Correspondingly, the number of first touch signal lines corresponding to the opening area is less. Even if the first touch signal lines are arranged around the opening area, there will be no large black frame around the opening area.

Alternatively, in some embodiments, as shown in FIG. 12, the display panel further includes: a plurality of fourth connection leads 29 extending in the first direction X.

The plurality of touch signal lines 27 include: a plurality of first touch signal lines 2701 disconnected in the opening area 3, a plurality of second touch signal lines 2702 located outside the opening area 3 in the first direction X, and a plurality of third connection leads 2703 located outside the opening area 3 in the first direction X. The plurality of third connection leads 2703 extend from the display area 1 to the peripheral area 2 in the second direction Y.

The first touch signal lines 2701 are adjacent to the first data lines 4, and the second touch signal lines 2702 and the third connection leads 2703 are adjacent to the second data lines 9.

The first touch signal line 2701 includes: a first sub-touch signal line 2701-1 adjacent to the first sub-data line 401 and a second sub-touch signal line 2701-2 adjacent to the second sub-data line 402.

Both ends of the fourth connection lead 29 are electrically connected with the first sub-touch signal line 2701 and the third connection lead 2703 respectively.

The second touch signal line 2702, the third connection lead 2703 and the second sub-touch signal line 2701-2 are all electrically connected with the touch signal input terminal 24.

In the display panel according to embodiments of the disclosure, the first touch signal line is disconnected in the opening area, the first sub-touch signal line located on a side of the opening area is electrically connected with the touch signal input terminal through the fourth connection lead and the third connection lead located outside the opening area, and the second sub-touch signal line located on the other side of the opening area is also electrically connected with the touch signal input terminal, so as to provide a touch signal to the first touch signal line disconnected in the opening area. Since the first touch signal line is disconnected in the opening area, that is, the first touch signal line does not need to be arranged around the opening area, avoiding the increased diameter of the area surrounded by the display area due to the first touch signal line arranged around the opening area, and also avoiding black edges in the opening area, improving the display effect, and improving the user experience.

In some embodiments, as shown in FIGS. 13 and 14, the third connection lead 2703 includes: a sixteenth part 2703-1 arranged in the same layer as and adjacent to the second data line 9, a seventeenth part 2703-2 electrically connected with the sixteenth part 2703-1 and the touch signal terminal 24, and an eighteenth part 2703-3 electrically connected with the sixteenth part 2703-1 on the side of the sixteenth part 2703-1 away from the touch signal terminal 24. The orthographic projections of the eighteenth part 2703-3 and the seventeenth part 2703-2 parallel to the plane where the display panel is located both overlap with the data selection control signal line 10, the eighteenth part 2703-3 and the seventeenth part 2703-2 are arranged in the same layer, and the seventeenth part 2703-2 and the sixteenth part 2703-1 are located in different layers. During specific implementation, the seventeenth part 2703-2 and the eighteenth part 2703-3 are arranged in the same layer as the scan line 12, for example.

In some embodiments, as shown in FIG. 12, the fourth connection lead 29 is located on a side of the second connection lead 8 away from the display area 1.

In some embodiments, as shown in FIG. 13, the first sub-touch signal line 2701-1 includes: a seventh part 2701-1-1 arranged in the same layer as and adjacent to the second sub-data line 402, and an eighth part 2701-1-2 electrically connected with the seventh part 2701-1-1 on the side of the seventh part 2701-1-1 away from the opening area. The orthographic projection of the eighth part 2701-1-2 on the plane where the display panel is located overlaps with the orthographic projection of the second connection lead 8 and the orthographic projection of the data selection control signal line 10 on the plane where the display panel is located, and the eighth part 2701-1-2 and the seventh part 2701-1-1 are located in different layers.

In some embodiments, as shown in FIG. 14, the second sub-touch signal line 2701-2 includes: a ninth part 2701-2-1 arranged in a same layer as and adjacent to the second sub-data line 402, and a tenth part 2701-2-2 electrically connected with the ninth part 2701-2-1 on a side of the ninth part 2701-2-1 away from the opening area.

The second touch signal line 2702 includes: an eleventh part 2702-1 arranged in a same layer as and adjacent to the second data line 9, and a twelfth part 2702-2 electrically connected with the eleventh part 2702-1 on a side of the eleventh part 2702-1 close to the touch signal input terminal 24.

The orthographic projections of the eighth part 2701-1-2 and the tenth part 2701-2-2 on the plane where the display panel is located overlap with the orthographic projection of the second connection lead 8 and the orthographic projection of the data selection control signal line 10 on the plane where the display panel is located, and the orthographic projection of the twelfth part 2702-1 on the plane where the display panel is located overlaps with the orthographic projection of the data selection control signal line 10 on the plane where the display panel is located.

During specific implementation, the eighth part 2701-1-2, the tenth part 2701-2-2 and the twelfth part 2702-1 are arranged in the same layer as the scan line 12, for example.

During specific implementation, the first sub-touch signal line and the second sub-touch signal line can be electrically connected with different touch signal input terminals, or the first sub-touch signal line and the second sub-touch signal line can be electrically connected with the same touch signal input terminal.

In some embodiments, as shown in FIGS. 10 to 14, when the display panel includes touch signal lines 27, the display panel may also include dummy signal lines 21; and as shown in FIGS. 10 and 13, some of the dummy signal lines 21 are disconnected in the opening area 3.

At least some second data lines 9 adjacent to neither of the touch signal lines 27 and the first connection leads 7 are adjacent to the dummy signal lines 21, and at least some first data lines 4 not adjacent to the touch signal lines 27 are adjacent to the dummy signal lines 21.

During specific implementation, as shown in FIGS. 10 to 14, for the touch signal line 27 adjacent to the first data line 4, the touch signal line 27 is adjacent to the first data line 4 on the left side of the first data line 4; for the touch signal line 27 adjacent to the second data line 9, the touch signal line 27 is adjacent to the second data line 9 on the left side of the second data line 9; for the dummy signal line 21 adjacent to the first data line 4, the dummy signal line 21 is adjacent to the first data line 4 on the left side of the first data line 4; and for the dummy signal line 21 adjacent to the second data line 9, the dummy signal line 21 is adjacent to the second data line 9 on the left side of the second data line 9.

That is, during specific implementation, for the touch signal line adjacent to the first data line, the touch signal line is located in the area between the first data line and the sub-pixel column, and the sub-pixel column is adjacent and not electrically connected with the first data line. For the touch signal line adjacent to the second data line, the touch signal line is located in the area between the second data line and the sub-pixel column, and the sub-pixel column is adjacent and not electrically connected with the second data line. For the dummy signal line adjacent to the first data line, the dummy signal line is located in the area between the first data line and the sub-pixel column, and the sub-pixel column is adjacent and not electrically connected with the first data line. For the dummy signal line adjacent to the second data line, the dummy signal line is located in the area between the second data line and the sub-pixel column, and the sub-pixel column is adjacent and not electrically connected with the second data line.

In some embodiments, as shown in FIGS. 11, 13 and 14, in each data selector MUX, the source S1 of the first transistor TFT1, the source S2 of the second transistor TFT2, and the source S3 of the third transistor TFT3 are all electrically connected with the same first data selection data line 6 or the same second data selection data line 14.

In each data selector MUX, the drain D1 of the first transistor TFT1, the drain D2 of the second transistor TFT2, and the drain D3 of the third transistor TFT3 are electrically connected with different first data lines 4 or different second data lines 9 respectively.

The first data line 401-1/402-1 electrically connected with the drain D1 of the first transistor TFT1 is adjacent to the first touch signal line 2701 or the dummy signal line 21; and the second data line 901 electrically connected with the drain D1 of the first transistor TFT1 is adjacent to one of the second touch signal line 2702, the third connection lead 2703 and the dummy signal line 21.

The first data line 401-2/402-2 electrically connected with the drain D2 of the second transistor TFT2 is adjacent to the dummy signal line 21; and the second data line 902 electrically connected with the drain D2 of the second transistor TFT2 is adjacent to one of the first connection lead 7 or the dummy signal line 21.

It should be noted that some second data lines 902 electrically connected with the drain D2 of the second transistor TFT2 need to be adjacent to the first connection leads 7, so that other second data lines 902 electrically connected with the drain D2 of the second transistor TFT2 are adjacent to the dummy signal lines 21, and the first data line 402-1/402-2 electrically connected with the drain D2 of the second transistor TFT2 is adjacent to the dummy signal line 21, that is, the second data lines or the first data lines electrically connected with the drain D2 of the second transistor TFT2 are all adjacent to other signal lines, thus improving the display uniformity. Furthermore, some first data lines 401-1/402-1 electrically connected with the drain D1 of the first transistor TFT1 need to be adjacent to the touch signal lines 27, and some second data lines 901 electrically connected with the drain D1 of the first transistor TFT1 need to be adjacent to the touch signal lines 27, so that other first data lines 401-1/402-1 electrically connected with the drain D1 of the first transistor TFT1 are adjacent to the dummy signal lines 21, and other second data lines 901 electrically connected with the drain D1 of the first transistor TFT1 are adjacent to the dummy signal lines 21, thus improving the display uniformity.

During specific implementation, the arrangement of the dummy signal lines is for purpose of improving the display uniformity. When the display panel is working, there is no need to provide signals to the dummy signal lines, that is, the dummy signal lines do not need to transmit the touch signals, and the dummy signal lines do not need to transmit the same signals as the first connection leads.

In some embodiments, as shown in FIGS. 11, 13, and 14, the first data line 401-3/402-3 electrically connected with the drain D3 of the third transistor TFT3 is adjacent to neither of the touch signal line 27 and the dummy signal line 21; and the second data line 903 electrically connected with the drain D3 of the third transistor TFT3 is adjacent to none of the first connection lead 7, the touch signal line 27 and the dummy signal line 21.

In the first direction X, the width of the first data line 401-3/402-3 electrically connected with the drain D3 of the third transistor TFT3 is greater than the width of the first data line 401-2/402-2 electrically connected with the drain D2 of the second transistor TFT2 and the width of the first data line 401-1/402-1 electrically connected with the drain D1 of the first transistor TFT1; and the width of the second data line 903 electrically connected with the drain D3 of the third transistor TFT3 is greater than the width of the second data line 902 electrically connected with the drain D2 of the second transistor TFT2 and the width of the second data line 901 electrically connected with the drain D1 of the first transistor TFT1.

In the display panel according to embodiments of the disclosure, the first data line 401-1/402-1/401-2/402-2 is adjacent to any one of the touch signal line 27 and the dummy signal line 21, and the first data line 401-3/402-3 is adjacent to neither of the touch signal line 27 and the dummy signal line 21. The second data line 901/902 is adjacent to any one of the first connection lead 7, the touch signal line 27 and the dummy signal line 21. The second data line 903 is adjacent to none of the first connection lead 7, the touch signal line 27 and the dummy signal line 21. The width of the first data line 401-3/402-3 is greater than the width of the remaining first data line 401-1/402-1/401-2/402-2, and the width of the second data line 903 is greater than the width of the remaining second data line 901/902, so that the total widths of various types of signal lines arranged between two adjacent columns of sub-pixels are proximate to each other, thus improving the display uniformity and improving the display effect.

An embodiment of the disclosure provides a display device, including the display panel according to embodiments of the disclosure.

The display device according to embodiments of the disclosure is a mobile phone, a tablet, a television, a display, a laptop, a digital photo frame, a navigator, or any other product or component with display function. All of other indispensable components of the display device should be understood by those ordinary skilled in the art to be included, and will be omitted here and should not be considered as limitations on the disclosure. The implementations of this display device can refer to embodiments of the above-mentioned display panel, and the repeated description thereof will be omitted here.

To sum up, in the display panel and display device according to embodiments of the disclosure, the first data lines are disconnected in the opening area, the first sub-data line located on a side of the opening area is electrically connected with the data signal input terminal through the data selector, the first sub-data selection data line, and the first connection lead located outside the opening area, and the second sub-data line located on the other side of the opening area is also electrically connected with the data signal input terminal through the data selector and the second sub-data selection data line, so as to provide data signals to the first data lines disconnected in the opening area to achieve the normal display. The first data lines are disconnected in the opening area, that is, the first data lines do not need to be arranged around the opening area, avoiding the increased diameter of the area surrounded by the display area due to the first data lines arranged around the opening area, and also avoiding black edges in the opening area, improving the display effect, and improving the user experience. Moreover, a data selector is electrically connected with a plurality of first data lines, and the data selector is electrically connected with the data signal input terminal through the first data selection data line, that is, the data selector is configured to provide a data signal to the first data line. One data selector can provide data signals to the plurality of first data lines, reducing the number of data signal input terminals and saving the cost. Also, the number of first data selection data lines is also less than the number of first data lines, reducing the number of leads provided in the peripheral area. This is more conducive to reducing the size of the peripheral area while saving the cost, and is more conducive to realizing the narrow frame display.

Although embodiments of the invention have been described, those skilled in the art can make additional alterations and modifications to these embodiments once they learn about the basic creative concepts. Thus the attached claims are intended to be interpreted to include embodiments as well as all the alterations and modifications falling within the scope of the invention.

Evidently those skilled in the art can make various modifications and variations to embodiments of the invention without departing from the spirit and scope of embodiments of the invention. Thus the invention is also intended to encompass these modifications and variations therein as long as these modifications and variations to embodiments of the invention come into the scope of the claims of the invention and their equivalents.

What is claimed is:

1. A display panel, comprising: a display area, a peripheral area outside the display area, and an opening area located in the display area;
the display panel comprises:
a plurality of first data lines arranged in a first direction and extending from the display area to the peripheral area in a second direction; wherein the first data lines comprise first sub-data lines and second sub-data lines respectively located on both sides of the opening area in the second direction, and the second direction intersects the first direction;
a plurality of data selectors located in the peripheral area, comprising: a plurality of first data selectors located in the peripheral area on a side of the first sub-data lines away from the opening area, and a plurality of second data selectors located in the peripheral area on a side of the second sub-data lines away from the opening area; wherein the first data selectors are electrically connected with the first sub-data lines, and the second data selectors are electrically connected with the second sub-data lines;
a plurality of data signal input terminals located on a side of the second data selectors away from the display area;
a plurality of first data selection data lines, comprising: first sub-data selection data lines located on a side of the first data selectors away from the display area in the second direction, and second sub-data selection data lines located between the second data selectors and the data signal input terminals in the second direction; wherein the first sub-data selection data lines are electrically connected with the first data selectors, and the second sub-data selection data lines are electrically connected with the second data selectors and the data signal input terminals; and
a plurality of first connection leads located outside the opening area in the first direction and extending from the display area to the peripheral area in the second direction; wherein the first sub-data selection data lines are electrically connected with the data signal input terminals through the first connection leads.

2. The display panel according to claim 1, further comprising: a plurality of second connection leads located in the peripheral area and extending in the first direction;
wherein the second connection leads are electrically connected with the first data selection data lines and the first connection leads.

3. The display panel according to claim 2, wherein the first sub-data selection data line and the second sub-data selection data line comprised in the first data selection data line are electrically connected with different data signal input terminals respectively; and
the second connection leads are electrically connected with the first data selection data lines and the first connection leads in the peripheral area on the side of the first data selectors away from the opening area.

4. The display panel according to claim 2, wherein the first sub-data selection data line and the second sub-data selection data line comprised in the first data selection data line are electrically connected with a same data signal input terminal; and
the second connection leads comprise: a plurality of first sub-connection leads and a plurality of second sub-connection leads located in the peripheral area and extending in the first direction;
the first sub-connection leads are electrically connected with the first sub-data selection data lines and the first connection leads in the peripheral area on the side of the second data selectors away from the opening area; and the second sub-connection leads are electrically connected with the second sub-data selection data lines and the first connection leads in the peripheral area on the side of the second data selectors away from the opening area.

5. The display panel according to claim 2, wherein a length of the second connection lead close to the display area is less than a length of the second connection lead away from the display area in the peripheral area located on a same side of the display area;

orthographic projections of the plurality of second connection leads on a plane where the display panel is located do not overlap with each other; and the plurality of second connection leads are arranged in a same layer; and except for positions of electrical connections between the second connection leads and the first connection leads and positions of electrical connections between the second connection leads and the first sub-data selection data lines, the orthographic projections of the second connection leads on the plane where the display panel is located do not overlap with orthographic projections of the first connection leads on the plane where the display panel is located, and the orthographic projections of the second connection leads on the plane where the display panel is located do not overlap with orthographic projections of the first sub-data selection data lines on the plane where the display panel is located.

6. The display panel according to claim 2, wherein orthographic projections of the plurality of second connection leads on a plane where the display panel is located do not overlap with each other; and the plurality of second connection leads are arranged in a same layer;

except for positions of electrical connections between the second connection leads and the first connection leads and positions of electrical connections between the second connection leads and the first data selection data lines, the first connection leads and the second connection leads with overlapped orthographic projections on a plane where the display panel is located are located in different film layers, and the first data selection data lines and the second connection leads with overlapped orthographic projections on the plane where the display panel is located are located in different film layers; and lengths of the second connection leads are equal in the peripheral area located on a same side of the display area.

7. The display panel according to claim 6, further comprising:

a plurality of second data selection data lines extending from the display area to the peripheral area in the second direction;

wherein the second data selectors that are not electrically connected with the first data selection data lines are electrically connected with the data signal input terminals through the second data selection data lines.

8. The display panel according to claim 7, wherein the second data selection data line comprises a sixth part located in a different layer from the second data line.

9. The display panel according to claim 2, further comprising a plurality of second data lines; wherein the second data lines are located outside the opening area in the first direction and extend from the display area to the peripheral area in the second direction; some of the plurality of second data selectors are electrically connected with the plurality of second sub-data lines, and other of the plurality of second data selectors are electrically connected with the plurality of second data lines; and each of the first connection leads is adjacent to one of the second data lines.

10. The display panel according to claim 9, further comprising:

a plurality of data selection control signal lines located in the peripheral area and comprising parts extending in the first direction; wherein the plurality of data selection control signal lines comprise: a plurality of first data selection control signal lines electrically connected with the first data selectors, and a plurality of second data selection control signal lines electrically connected with the second data selectors;

the second connection leads are located on a side of the data selection control signal lines away from the display area; the first connection lead comprises: a first part, and a second part and a third part respectively connected with the first part on both sides of the first part in the second direction; the second part is located on a side of the first part away from the data signal input terminal, and the third part is located on a side of the first part close to the data signal input terminal;

an orthographic projection of the first part on a plane where the display panel is located does not overlap with orthographic projections of the data selection control signal lines on the plane where the display panel is located, an orthographic projection of the second part on the plane where the display panel is located overlaps with orthographic projections of the first data selection control signal lines on the plane where the display panel is located, and an orthographic projection of the third part on the plane where the display panel is located overlaps with orthographic projections of the second data selection control signal lines on the plane where the display panel is located; and the data selection control signal lines and the second data lines are arranged in a same layer; the first part and the second data lines are arranged in a same layer and adjacent; and the second part and the third part are arranged in a same layer and located in a different layer from the first part.

11. The display panel according to claim 10, wherein the second connection leads and the data selection control signal lines are arranged in a same layer.

12. The display panel according to claim 10, wherein the first sub-data selection data line comprises: a fourth part located in a different layer from the data selection control signal line;

the second sub-data selection data line comprises: a fifth part located in a different layer from the data selection control signal line; and an orthographic projection of the fourth part on the plane where the display panel is located overlaps with an orthographic projection of the data selection control signal line on the plane where the display panel is located, and an orthographic projection of the fifth part on the plane where the display panel is located overlaps with the orthographic projection of the data selection control signal line on the plane where the display panel is located.

13. The display panel according to claim 9, further comprising a plurality of dummy signal lines extending in the second direction; wherein some of the dummy signal lines are disconnected in the opening area; and at least some of the second data lines not adjacent to the first connection leads are adjacent to the dummy signal lines, and at least some of the first data lines are adjacent to the dummy signal lines.

14. The display panel according to claim 13, wherein the dummy signal lines, the first data lines and the second data lines are arranged in a same layer.

15. The display panel according to claim 9, further comprising: a plurality of touch signal lines extending from the display area to the peripheral area in the second direction, and a plurality of touch signal input terminals; wherein the touch signal lines are electrically connected with the touch signal input terminals; and the touch signal input terminal is located between two adjacent data signal input terminals.

16. The display panel according to claim 15, further comprising a dummy signal line;

wherein the data selector comprises: a first transistor, a second transistor and a third transistor;

the plurality of data selection control signal lines comprise: a first data selection control signal line, a second data selection control signal line, and a third data selection control signal line;

a gate of the first transistor is electrically connected with the first data selection control signal line, a gate of the second transistor is electrically connected with the second data selection control signal line, and a gate of the third transistor is electrically connected with the third data selection control signal line;

in each of the data selectors, a source of the first transistor, a source of the second transistor and a source of the third transistor are all electrically connected with a same first data selection data line or a same second data selection data line;

in each of the data selectors, a drain of the first transistor, a drain of the second transistor and a drain of the third transistor are electrically connected with different first data lines or different second data lines respectively;

the first data line electrically connected with the drain of the first transistor is adjacent to the dummy signal line or the touch signal line; and the second data line electrically connected with the drain of the first transistor is adjacent to the dummy signal line or the touch signal line; and the first data line electrically connected with the drain of the second transistor is adjacent to the dummy signal line; and the second data line electrically connected with the drain of the second transistor is adjacent to the first connection lead or the dummy signal line.

17. The display panel according to claim 16, wherein the first data line electrically connected with the drain of the third transistor is not adjacent to the dummy signal line or the touch signal line, and the second data line electrically connected with the drain of the third transistor is not adjacent to any of the first connection lead, the dummy signal line and the touch signal line; and in the first direction, a width of the first data line electrically connected with the drain of the third transistor is greater than a width of the first data line electrically connected with the drain of the second transistor and a width of the first data line electrically connected with the drain of the first transistor; and a width of the second data line electrically connected with the drain of the third transistor is greater than a width of the second data line electrically connected with the drain of the second transistor and a width of the second data line electrically connected with the drain of the first transistor.

18. The display panel according to claim 15, further comprising: a plurality of fourth connection leads extending in the first direction;

wherein the plurality of touch signal lines comprise: a plurality of first touch signal lines disconnected in the opening area, a plurality of second touch signal lines located outside the opening area in the first direction, and a plurality of third connection leads located outside the opening area in the first direction;

the first touch signal lines are adjacent to the first data lines, and the second touch signal lines and the third connection leads are adjacent to the second data lines;

the first touch signal line comprises: a first sub-touch signal line adjacent to the first sub-data line, and a second sub-touch signal line adjacent to the second sub-data line;

both ends of the fourth connection lead are electrically connected with the first sub-touch signal line and the third connection lead respectively; and the second touch signal line, the third connection lead, and the second sub-touch signal line are all electrically connected with the touch signal input terminal.

19. The display panel according to claim 18, wherein the fourth connection leads are located on a side of the second connection leads away from the display area;

the first sub-touch signal line comprises: a seventh part arranged in a same layer as and adjacent to the first sub-data line, and an eighth part electrically connected with the seventh part on a side of the seventh part away from the opening area;

the second sub-touch signal line comprises: a ninth part arranged in a same layer as and adjacent to the second sub-data line, and a tenth part electrically connected with the ninth part on a side of the ninth part away from the opening area;

the second touch signal line comprises: an eleventh part arranged in a same layer as and adjacent to the second data line, and a twelfth part electrically connected with the eleventh part on a side of the eleventh part close to the touch signal input terminal; and in a direction perpendicular to the plane where the display panel is located, an orthographic projection of the eighth part overlaps with an orthographic projection of the second connection lead and an orthographic projection of the data selection control signal line, an orthographic projection of the tenth part overlaps with the orthographic projection of the second connection lead and the orthographic projection of the data selection control signal line, and an orthographic projection of the twelfth part overlaps with the orthographic projection of the data selection control signal line.

20. The display panel according to claim 1, further comprising: a plurality of scan lines extending from the display area to the peripheral area in the second direction;

wherein the scan lines comprise: a first scan line located outside the opening area, and a second scan line disconnected in the opening area.

* * * * *